(12) United States Patent
Ren et al.

(10) Patent No.: US 11,973,087 B2
(45) Date of Patent: Apr. 30, 2024

(54) ARRAY SUBSTRATE AND METHOD OF MANUFACTURING THE SAME, AND DISPLAY PANEL

(71) Applicants: Hefei Xinsheng Optoelectronics Technology Co., Ltd., Anhui (CN); BOE TECHNOLOGY GROUP CO., LTD., Beijing (CN)

(72) Inventors: Wenming Ren, Beijing (CN); Jinliang Hu, Beijing (CN); Jian Ma, Beijing (CN); Chengyong Zhan, Beijing (CN)

(73) Assignees: Hefei Xinsheng Optoelectronics Technology Co., Ltd., Anhui (CN); BOE TECHNOLOGY GROUP CO., LTD., Beijing (CN)

( * ) Notice: Subject to any disclaimer, the term of this patent is extended or adjusted under 35 U.S.C. 154(b) by 420 days.

(21) Appl. No.: 17/297,655

(22) PCT Filed: Sep. 29, 2020

(86) PCT No.: PCT/CN2020/119046
§ 371 (c)(1),
(2) Date: May 27, 2021

(87) PCT Pub. No.: WO2022/067574
PCT Pub. Date: Apr. 7, 2022

(65) Prior Publication Data
US 2022/0310670 A1  Sep. 29, 2022

(51) Int. Cl.
*H01L 27/12* (2006.01)
*G02F 1/1368* (2006.01)

(52) U.S. Cl.
CPC ........ *H01L 27/1248* (2013.01); *G02F 1/1368* (2013.01); *H01L 27/1296* (2013.01)

(58) Field of Classification Search
CPC ............. H01L 27/1248; H01L 27/1296; H01L 27/1214; G02F 1/1368; G02F 1/134372;
(Continued)

(56) References Cited

U.S. PATENT DOCUMENTS 8,879,041 B2   11/2014   Morita
9,244,318 B2   1/2016   Morita
(Continued)

FOREIGN PATENT DOCUMENTS

CN   102759824   10/2012
CN   104698704   6/2015
(Continued)

OTHER PUBLICATIONS

Machine translation of CN-205248273 (Year: 2016).*
Annotated Machine translation of CN-205248273 (Year: 2016).*
Written Opinion from PCT/CN2020/119046 dated Apr. 26, 2021.

*Primary Examiner* — J. E. Schoenholtz
(74) *Attorney, Agent, or Firm* — Calfee, Halter & Griswold LLP

(57) ABSTRACT

The present disclosure provides an array substrate and a method of manufacturing the same and a display panel, which belongs to the field of display technologies. The method of manufacturing the array substrate comprises: providing a base substrate; forming a drive circuit layer on the base substrate, wherein the drive circuit layer includes a switching transistor; forming an insulating material layer on one side of the drive circuit layer distal to the base substrate, wherein the insulating material layer has a connection via-hole exposing at least a part region of a drain electrode of the switching transistor; and forming an electrode layer on one side of the insulating material layer distal to the base substrate, wherein a surface of the electrode layer distal to the base substrate has groove structures extending to the
(Continued)

connection via-hole. The manufacturing method may avoid the occurrence of poor coating in forming an orientation layer.

24 Claims, 13 Drawing Sheets

(58) Field of Classification Search
CPC ........... G02F 1/133711; G02F 1/13439; G02F 1/136227
See application file for complete search history.

(56) References Cited

U.S. PATENT DOCUMENTS

| | | |
|---|---|---|
| 9,298,042 B2 | 3/2016 | Tomioka et al. |
| 9,389,473 B2 | 7/2016 | Morita |
| 9,519,196 B2 | 12/2016 | Tomioka et al. |
| 9,817,288 B2 | 11/2017 | Tomioka et al. |
| 9,939,698 B2 | 4/2018 | Tomioka et al. |
| 10,018,885 B1 | 7/2018 | Tomioka et al. |
| 10,146,096 B2 | 12/2018 | Tomioka et al. |
| 10,241,372 B2 | 3/2019 | Tomioka et al. |
| 10,495,933 B2 | 12/2019 | Liu et al. |
| 10,866,474 B2 | 12/2020 | Ozeki et al. |
| 10,877,337 B2 | 12/2020 | Tomioka et al. |
| 2012/0268678 A1 | 10/2012 | Tomioka et al. |
| 2013/0194532 A1 | 8/2013 | Morita |
| 2015/0015841 A1 | 1/2015 | Morita |
| 2015/0160521 A1 | 6/2015 | Tomioka et al. |
| 2016/0085107 A1 | 3/2016 | Morita |
| 2017/0075179 A1 | 3/2017 | Tomioka et al. |
| 2017/0108744 A1 | 4/2017 | Tsuei et al. |
| 2018/0046047 A1 | 2/2018 | Tomioka et al. |
| 2018/0180957 A1 | 6/2018 | Tomioka et al. |
| 2018/0292722 A1 | 10/2018 | Tomioka et al. |
| 2018/0314106 A1 | 11/2018 | Yang et al. |
| 2019/0064619 A1 | 2/2019 | Tomioka et al. |
| 2019/0086748 A1* | 3/2019 | Liu ................... G02F 1/1343 |
| 2019/0094638 A1* | 3/2019 | Li ................... G02F 1/134309 |
| 2019/0101801 A1 | 4/2019 | Ozeki et al. |
| 2019/0171074 A1 | 6/2019 | Tomioka et al. |
| 2019/0302552 A1* | 10/2019 | Muto ............... G02F 1/133711 |
| 2020/0103688 A1 | 4/2020 | Lee et al. |
| 2022/0350187 A1* | 11/2022 | Lv ................... G02F 1/134309 |

FOREIGN PATENT DOCUMENTS

| | | | |
|---|---|---|---|
| CN | 205248273 U | * | 5/2016 |
| CN | 106444187 | | 2/2017 |
| CN | 106597761 | | 4/2017 |
| JP | 2017211678 | | 11/2017 |

* cited by examiner

ARRAY SUBSTRATE AND METHOD OF MANUFACTURING THE SAME, AND DISPLAY PANEL

CROSS-REFERENCE TO RELATED APPLICATIONS

The present application is the 371 application of PCT Application No. PCT/CN2020/119046, filed on Sep. 29, 2020, the entire contents of both of which are hereby incorporated by reference.

TECHNICAL FIELD

The present disclosure relates to the field of display technology, and more particularly, to an array substrate and a method of manufacturing the same, and a display panel.

BACKGROUND

Thin-film transistor liquid crystal display panels realize the orientation control of liquid crystals through an orientation film, and the quality of the orientation film has a direct impact on the picture effect of the display panel.

In the preparation of the liquid crystal display panels, the orientation film of an array substrate is prone to poor coating, which reduces the yield of the array substrate and degrades the picture quality of the liquid crystal display panels.

The foregoing information disclosed in this section are provided only for acquiring a better understanding of the background of the present disclosure, and therefore may include information that does not constitute prior art known to those of ordinary skill in the art.

SUMMARY

It is an object of the present disclosure to provide an array substrate and a method of manufacturing the same and a display panel, thus avoiding poor coating of an orientation layer.

In order to achieve the above-mentioned object of the invention, the present disclosure adopts the following technical solutions:

According to a first aspect of the present disclosure, there is provided a method of manufacturing an array substrate, including:

providing a base substrate;

forming a drive circuit layer on the base substrate, wherein the drive circuit layer includes a switching transistor;

forming an insulating material layer on one side of the drive circuit layer distal to the base substrate, wherein the insulating material layer has a connection via-hole exposing at least a part region of a drain electrode of the switching transistor; and forming an electrode layer on one side of the insulating material layer distal to the base substrate, wherein a surface of the electrode layer distal to the base substrate has at least one groove structure extending to the connection via-hole.

In an exemplary embodiment of the present disclosure, forming the electrode layer on one side of the insulating material layer distal to the base substrate includes:

sequentially forming a first electrode layer, an insulating dielectric layer, and a second electrode layer which are laminated on one side of the insulating material layer distal to the base substrate, to form the electrode layer.

In an exemplary embodiment of the present disclosure, forming the insulating material layer on one side of the drive circuit layer distal to the base substrate includes:

forming an organic insulating layer on one side of the drive circuit layer distal to the base substrate, wherein the organic insulating layer has the connection via-hole exposing at least a part region of the drain electrode of the switching transistor.

In an exemplary embodiment of the present disclosure, the method of manufacturing the array substrate further includes:

forming an orientation layer on one side of the electrode layer distal to the base substrate.

In an exemplary embodiment of the present disclosure, the electrode layer is formed such that the second electrode layer includes a plurality of strip sub-electrodes and slits located among the strip sub-electrodes, wherein any one of the groove structures is in communication with one of the slits.

In an exemplary embodiment of the present disclosure, the second electrode layer is formed such that a width of the groove structure is the same as a width of the communicated slit.

In an exemplary embodiment of the present disclosure, the second electrode layer is formed such that an extension direction of the groove structure is the same as an extension direction of the communicated slit.

In an exemplary embodiment of the present disclosure, the second electrode layer is formed such that an orthographic projection of one end of the groove structure close to the slit on the base substrate overlaps with an orthographic projection of one end of the communicated slit close to the groove structure on the base substrate.

In an exemplary embodiment of the present disclosure, forming the electrode layer on one side of the insulating material layer distal to the base substrate includes:

forming the first electrode layer on one side of the insulating material layer distal to the base substrate;

forming the insulating dielectric layer on one side of the first electrode layer distal to the base substrate; and forming the second electrode layer on one side of the insulating dielectric layer distal to the base substrate, wherein the second electrode layer has drainage grooves, and the drainage grooves extend to the connection via-hole, to serve as the groove structures.

In an exemplary embodiment of the present disclosure, forming the electrode layer on one side of the insulating material layer distal to the base substrate includes:

forming the first electrode layer on one side of the insulating material layer distal to the base substrate;

forming the insulating dielectric layer on one side of the first electrode layer distal to the base substrate, wherein the insulating dielectric layer has a plurality of drainage grooves extending to the connection via-hole; and forming the second electrode layer on one side of the insulating dielectric layer distal to the base substrate, wherein the second electrode layer covers side walls and a bottom of the drainage groove, to form the groove structure.

In an exemplary embodiment of the present disclosure, forming the electrode layer on one side of the insulating material layer distal to the base substrate includes:

forming the first electrode layer on one side of the insulating material layer distal to the base substrate, wherein the first electrode layer has a plurality of drainage grooves, and the drainage grooves extend to the connection via-hole;

forming the insulating dielectric layer on one side of the first electrode layer distal to the base substrate; and forming the second electrode layer on one side of the insulating dielectric layer distal to the base substrate, wherein the insulating dielectric layer and the second electrode layer sequentially cover side walls and a bottom of the drainage groove, to form the groove structure.

According to a second aspect of the present disclosure, there is provided an array substrate, including:

a base substrate;

a drive circuit layer, disposed on one side of the base substrate and including a switching transistor;

an insulating material layer, disposed on one side of the drive circuit layer distal to the base substrate, and having a connection via-hole exposing at least a part region of a drain electrode of the switching transistor; and an electrode layer, disposed on one side of the insulating material layer distal to the base substrate, wherein a surface of the electrode layer distal to the base substrate has at least one groove structure extending to the connection via-hole.

In an exemplary embodiment of the present disclosure, the electrode layer includes a first electrode layer, an insulating dielectric layer, and a second electrode layer sequentially laminated on one side of the insulating material layer distal to the base substrate.

In an exemplary embodiment of the present disclosure, the insulating material layer includes an organic insulating layer, wherein the organic insulating layer has the connection via-hole exposing at least a part region of the drain electrode of the switching transistor.

In an exemplary embodiment of the present disclosure, the array substrate further includes:

an orientation layer, disposed on one side of the electrode layer distal to the base substrate.

In an exemplary embodiment of the present disclosure, the second electrode layer has a plurality of drainage grooves extending to the connection via-hole, and the drainage grooves serves as the groove structures of the electrode layer.

In an exemplary embodiment of the present disclosure, the insulating dielectric layer has a plurality of drainage grooves extending to the connection via-hole, the second electrode layer is bent inwardly into the drainage groove, to form the groove structure, and an orthographic projection of the groove structure on the insulating dielectric layer is located within the drainage groove.

In an exemplary embodiment of the present disclosure, the first electrode layer has a plurality of drainage grooves extending to the connection via-hole, the insulating dielectric layer and the second electrode layer cover a bottom and side walls of the drainage groove, to form the groove structure, and an orthographic projection of the groove structure on the first electrode layer is located within the drainage groove.

In an exemplary embodiment of the present disclosure, the groove structure has a depth of 300 to 1300 angstroms.

In an exemplary embodiment of the present disclosure, wherein a depth of the groove structure is equal to a thickness of the second electrode layer.

In an exemplary embodiment of the present disclosure, a length of a part of the groove structure within the connection via-hole is not less than 0.5 microns.

In an exemplary embodiment of the present disclosure, a part of the groove structure within the connection via-hole is located on a side wall of the connection via-hole.

In an exemplary embodiment of the present disclosure, a length of a part of the groove structure outside the connection via-hole is 2.0~5.0 microns.

In an exemplary embodiment of the present disclosure, the groove structure has a width of 3.0 to 5.0 microns.

In an exemplary embodiment of the present disclosure, the second electrode layer includes a plurality of strip sub-electrodes, and slits located among the strip sub-electrodes, wherein any one of the groove structures is in communication with one of the slits.

In an exemplary embodiment of the present disclosure, a width of the groove structure is the same as a width of the communicated slit.

In an exemplary embodiment of the present disclosure, an extension direction of the groove structure is the same as an extension direction of the communicated slit.

In an exemplary embodiment of the present disclosure, an orthographic projection of one end of the groove structure close to the slit on the base substrate overlaps with an orthographic projection of one end of the communicated slit close to the groove structure on the base substrate.

In an exemplary embodiment of the present disclosure, the second electrode layer includes a plurality of strip sub-electrodes and slits located among the strip sub-electrodes, the strip sub-electrode has a width of 2.5 to 3.5 microns, and the slit has a width of 3.0 to 5.0 microns.

In an exemplary embodiment of the present disclosure, a ratio of the width of the strip sub-electrode to the width of the slit is 0.5 to 0.8.

In an exemplary embodiment of the present disclosure, an opening of the connection via-hole is in a rectangular shape, a size of the opening of the connection via-hole close to the base substrate in an extension direction of a scan line in the drive circuit layer is 10-12 microns, and the size of the opening of the connection via-hole close to the base substrate in an extension direction of a data line in the drive circuit layer is 6.5-7.5 microns, and the second electrode layer has a common electrode and covers the connection via-hole, the second electrode layer includes a plurality of strip sub-electrodes, slits located among the strip sub-electrodes, and drainage grooves serving as the groove structures, wherein the strip sub-electrode has a width of 2.5 to 3.5 microns and the slit has a width of 3.0 to 5.0 microns, the drainage grooves are in communication with the slits and extend to the connection via-hole, a length of a part of the drainage groove within the connection via-hole is 6.0 to 6.5 microns, and the drainage groove and the communicated slit have the same width and extension direction.

In an exemplary embodiment of the present disclosure, the opening of the connection via-hole is in a circular shape, and the opening close to the base substrate has a diameter of 7 to 8 microns, and the second electrode layer has a common electrode and covers the connection via-hole, the second electrode layer includes a plurality of strip sub-electrodes, slits located among the strip sub-electrodes, and drainage grooves serving as the groove structures, wherein the strip sub-electrode has a width of 2.5 to 3.5 microns and the slit has a width of 3.0 to 5.0 microns, the drainage grooves are in communication with the slits and extend to the connection via-hole, a length of a part of the drainage groove within the connection via-hole is 0.8 to 1.2 microns, and the drainage groove and the communicated slit have the same width and extension direction.

In an exemplary embodiment of the present disclosure, an opening of the connection via-hole is in a rectangular shape, a size of the opening of the connection via-hole close to the base substrate in an extension direction of a scan line in the drive circuit layer is 11.5~13.5 microns, the size of the opening of the connection via-hole close to the base substrate in an extension direction of a data line in the drive circuit layer is 10 to 12 microns, and the size of the connection via-hole in the extension direction of the scan line is greater than the size of the connection via-hole in the extension direction of the data line, and the second electrode layer has a pixel electrode and covers the connection via-hole, the second electrode layer includes a plurality of strip sub-electrodes, slits located among the strip sub-electrodes, and drainage grooves serving as the groove structures, wherein the strip sub-electrode has a width of 2.5 to 3.5 microns and the slit has a width of 3.0 to 5.0 microns, the drainage grooves are in communication with the slits and extend to the connection via-hole, a length of a part of the drainage groove within the connection via-hole is 1.5 to 2.5 microns, and the drainage groove and the communicated slit have the same width and extension direction.

According to a third aspect of the present disclosure, there is provided a display panel, including the above-described array substrate.

BRIEF DESCRIPTION OF THE DRAWINGS

The above and other features and advantages of the present disclosure will become more apparent by detailed description of exemplary embodiments thereof with reference to the accompanying drawings.

Figure 1:
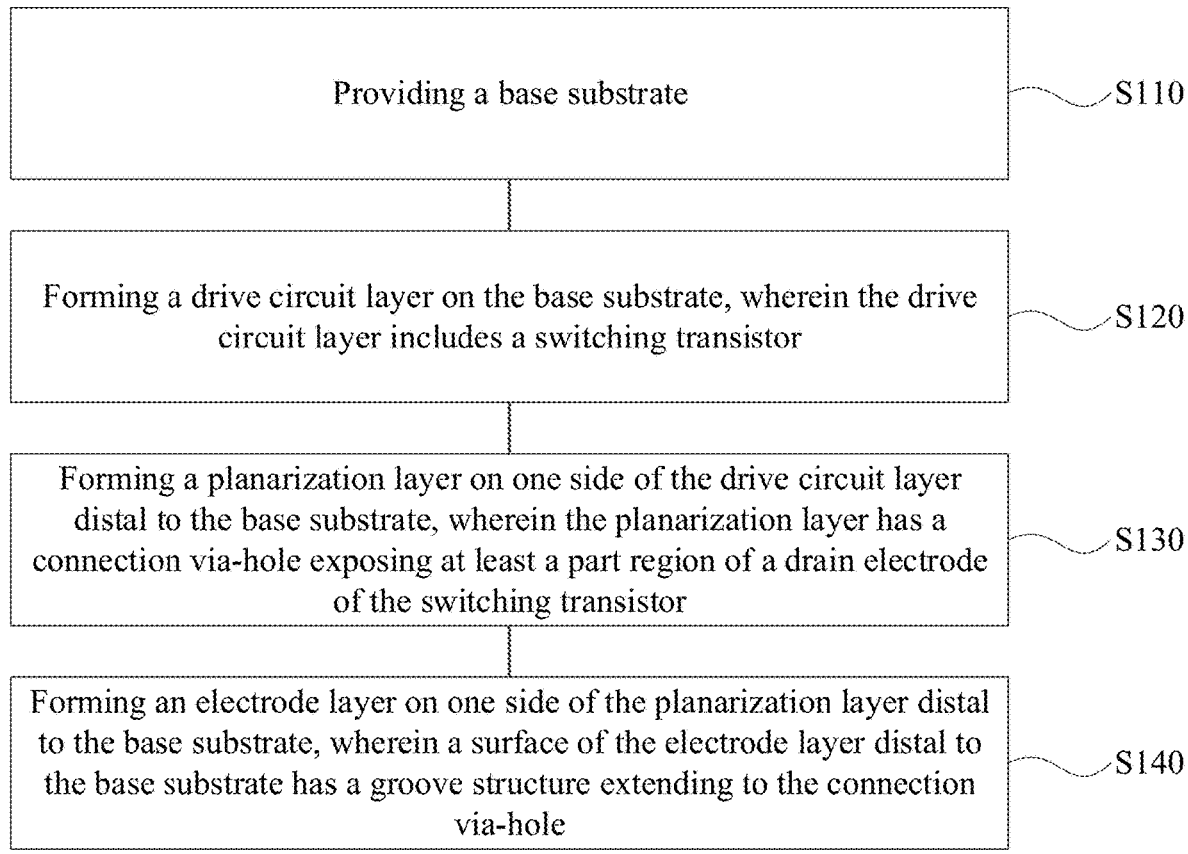
FIG. 1 is a schematic flow chart showing a method of manufacturing an array substrate according to an embodiment of the present disclosure.

The main components in the figures are denoted by the following reference signs:

100—base substrate; 200—drive circuit layer; 201—semiconductor layer; 202—gate insulating layer; 203—gate electrode layer; 204—interlayer dielectric layer; 205—source-drain metal layer; 210—switching transistor; 220—drain electrode; 300—insulating material layer; 301—passivation layer; 302—organic insulating layer; 310—connection via-hole; 311—top opening of connection via-hole; 312—bottom opening of connection via-hole; 400—electrode layer; 401—groove structure; 410—first electrode layer; 420—insulating dielectric layer; 430—second electrode layer; 500—orientation layer; 611—strip sub-electrode; 612—first connection portion; 613—second connection portion; 620—slit; 630—drainage groove; 710—data line; 720—scan line; 730—pixel electrode; 740—common electrode.

DETAILED DESCRIPTION

Exemplary embodiments will now be described more fully by reference to the accompanying drawings. However, the exemplary embodiments can be implemented in various forms and should not be understood as being limited to the examples set forth herein; rather, the embodiments are provided so that the present disclosure will be more thorough and complete, and the conception of exemplary embodiments will be fully conveyed to those skilled in the art. The described features, structures or characteristics may be combined in one or more embodiments in any appropriate manner. In the foregoing description, many specific details are provided for fully understanding embodiments of the present disclosure.

In the drawings, the thickness of the regions and layers may be exaggerated for clarity. The same reference numbers will be used throughout the drawings to refer to the same or like structures, and detailed descriptions will be repeated.

The described features, structures or characteristics may be combined in one or more embodiments in any appropriate manner. In the foregoing description, many specific details are provided for fully understanding embodiments of the present disclosure. However, those skilled in the art will recognize that technical solutions of the present disclosure may be practiced without one or more of the specific details, or, other methods, components, materials and so on may be used. In other cases, well-known structures, materials or operations are not shown or described in detail to avoid obscuring the main technical idea of the present disclosure.

Words "including" and "having" are used to mean open-ended inclusion and mean that in addition to the listed elements/components/etc., there may be additional elements/components/etc. Words "first" and "second" are used herein only as markers, and they do not limit the number of objects modified after them.

In the present disclosure, the depth of structure of a groove/hole/slit/etc., refers to the size of structure of the groove/hole/slit/etc., in a direction perpendicular to the base substrate. The thickness of a film layer/structure refers to the size of the film layer/structure in a direction perpendicular to the base substrate. The width of structure of the groove/hole/slit/etc., refers to the size of structure of the slot/hole/slit/etc., on a plane perpendicular to its extension direction and parallel to the base substrate.

In the related technology, when an array substrate for a LCD panel is prepared, poor coating tends to occur when orientation liquid is applied to the array substrate through a transfer print (APR, Asahikaseip Photosensitive Resin) plate by adopting a printing (Roller Coater) manner. This coating defect is especially obvious and serious when the array substrate is provided with an organic insulating layer between an electrode layer and a drive circuit layer.

The inventor has conducted an in-depth study on this problem. The inventor found that an insulating material layer located between the drive circuit layer and the electrode layer needs to be provided with a connection via-hole that exposes at least a part region of a drain electrode; and when the orientation liquid is coated by a printing manner, the orientation liquid tends to accumulate around the connection via-hole instead of entering the connection via-hole, resulting in uneven diffusion of the orientation liquid.

Especially when the insulating material layer includes an organic insulating layer, the organic insulating layer often has a larger thickness, for example, a thickness greater than 2 microns. The connection via-hole has a certain slope of for example 45 to 70°, leading to a larger size of the top of the connection via-hole on the insulating material layer, for example, it may be up to about 10 microns. When the orientation liquid is applied to the surface of the array substrate by a printing manner, due to surface tension, the orientation liquid cannot autonomously diffuse into the connection via-hole having a high-depth and a large aperture, and the orientation liquid builds up and is cured near the connection via-hole, which leads to a relative large height of the orientation layer at the edge of the connection via-hole, and thus leading to mura of the display panel.

In order to solve the above-mentioned technical problems, the present disclosure provides a method of manufacturing an array substrate. Referring to FIGS. 1 to 4, the method of manufacturing the array substrate includes:

In step S110, a base substrate 100 is provided.

In step S120, a drive circuit layer 200 is formed on the base substrate 100, wherein the drive circuit layer 200 includes a switching transistor 210.

In step S130, an insulating material layer 300 is formed on a side of the drive circuit layer 200 distal to the base substrate 100, wherein the insulating material layer 300 has a connection via-hole 310 exposing at least a part region of a drain (or source) electrode 220 of the switching transistor 210.

Figure 4:
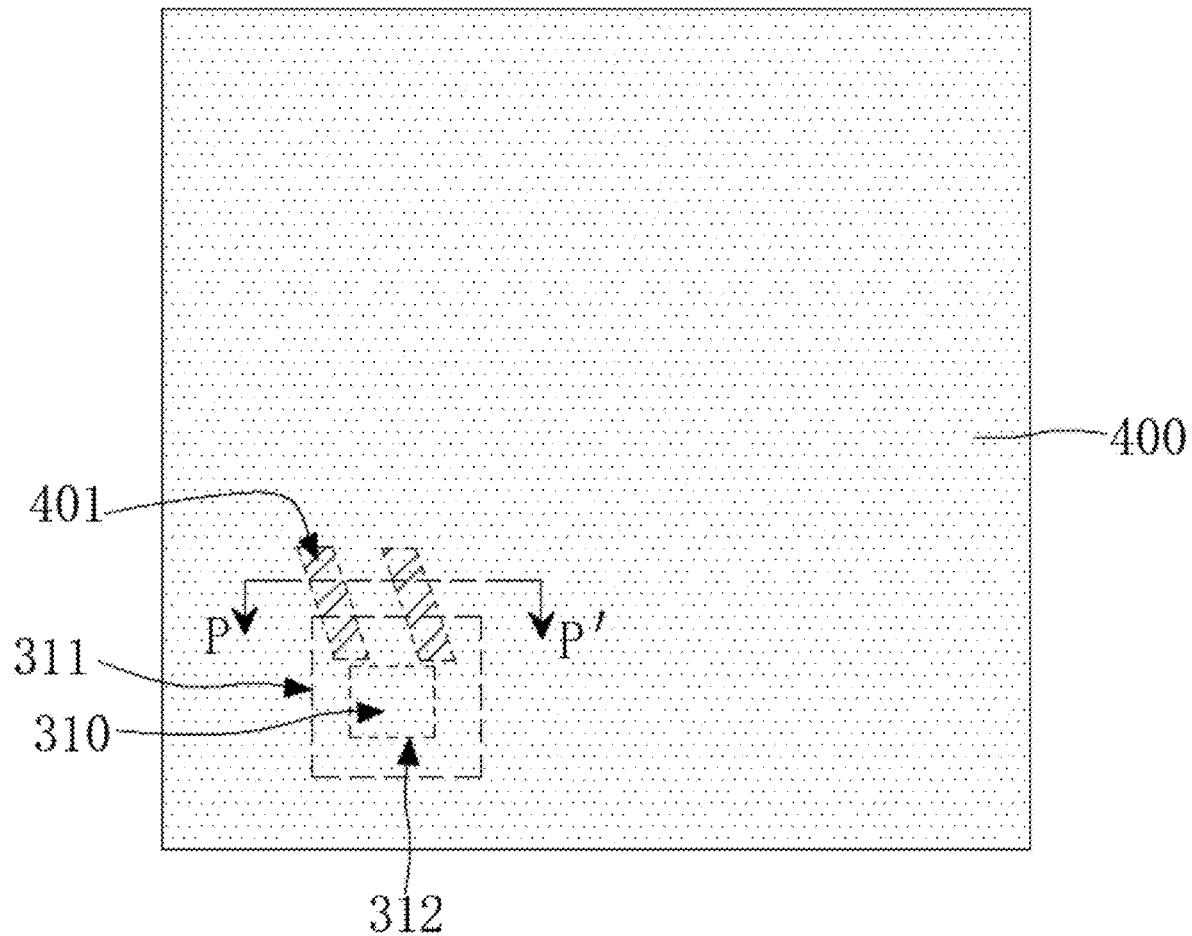
FIG. 4 is a top view structural schematic diagram of an electrode layer according to an embodiment of the present disclosure.

In step S140, an electrode layer 400 is formed on a side of the insulating material layer 300 distal to the base substrate 100. Referring to FIG. 4, a surface of the electrode layer 400 distal to the base substrate 100 has a groove structure 401 extending to the connection via-hole 310.

According to the method of manufacturing the array substrate provided by the present disclosure, when the electrode layer 400 is formed, the groove structure 401 that is in communication with the connection via-hole 310 is formed on the surface of the electrode layer 400. In this way, when an orientation layer 500 is formed, the groove structure 401 may play the role of guiding such that orientation liquid diffuses quickly into the connection via-hole 310 along the groove structure 401, reducing the difficulty of the orientation liquid to flow into the connection via-hole 310 and increasing the speed of the orientation liquid to flow into the connection via-hole 310, thus the orientation liquid is evenly diffused and poor coating of the orientation layer 500 is avoided.

Figure 2:
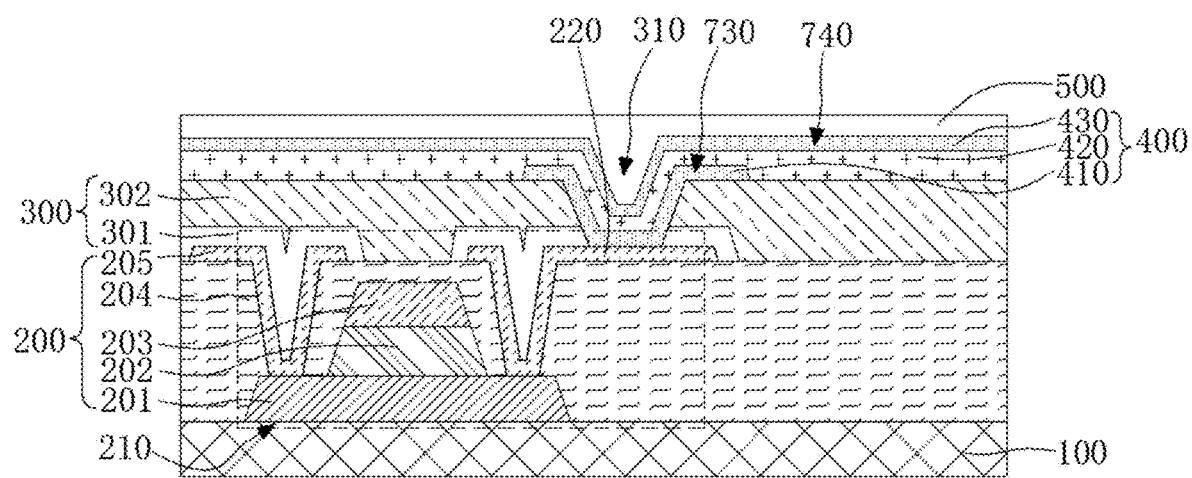
FIG. 2 is a cross-sectional structural schematic diagram illustrating an array substrate according to an embodiment of the present disclosure.
Figure 3:
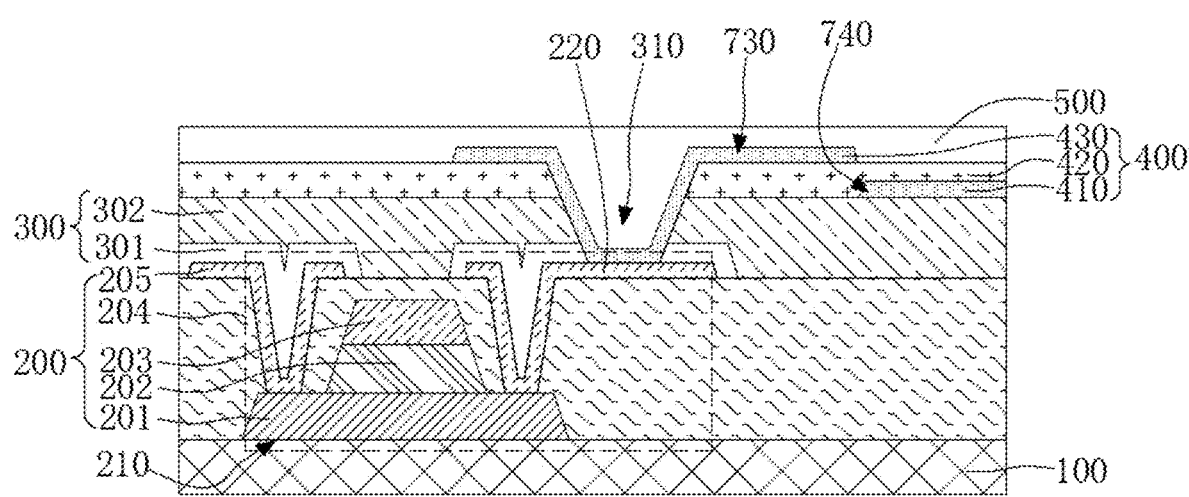
FIG. 3 is a cross-sectional structural schematic diagram illustrating an array substrate according to an embodiment of the present disclosure.

According to the method of manufacturing the array substrate provided by the present disclosure, referring to FIGS. 2 to 4, the formed array substrate includes the base substrate 100, the drive circuit layer 200, the insulating material layer 300 and the electrode layer 400 laminated in sequence. The drive circuit layer 200 is provided on one side of the base substrate 100 and includes the switching transistor 210. The insulating material layer 300 is provided on one side of the drive circuit layer 200 distal to the base substrate 100, and has the connection via-hole 310 that exposes at least a part region of the drain electrode 220 of the switching transistor 210. The electrode layer 400 is provided on one side of the insulating material layer 300 distal to the base substrate 100, and the surface of the electrode layer 400 distal to the base substrate 100 has the groove structure 401 extending to the connection via-hole 310. The array substrate of the present disclosure is manufactured by using the above-described method of manufacturing the array substrate, thus avoiding poor coating of the orientation layer 500, and improving both the yield of the array substrate and the picture quality of a display panel based on the array substrate.

Hereinafter, the principles, details and effects of the method of manufacturing the array substrate provided by the present disclosure will be further explained and illustrated in conjunction with the accompanying drawings.

In step S110, the base substrate 100 may be provided. The base substrate 100 may be a base substrate 100 of inorganic material or of organic material. For example, in an embodiment of the present disclosure, the material of the base substrate 100 may be a glass material such as soda-lime glass, quartz glass, sapphire glass, etc., or may be a metal material such as stainless steel, aluminum, nickel, etc. In another embodiment of the present disclosure, the material of the base substrate 100 may be Polymethyl methacrylate (PMMA), Polyvinyl alcohol (PVA), Polyvinyl phenol (PVP), Polyether sulfone (PES), polyimide, polyamide, polyacetal, Poly carbonate (PC), Polyethylene terephthalate (PET), Polyethylene naphthalate (PEN) or any combination thereof.

Optionally, before the step S120, a buffer dielectric layer such as a silicon nitride layer, a silicon oxide layer, a silicon oxynitride layer or other inorganic insulating material layers may be formed on the base substrate 100 as well. Then, the drive circuit layer 200 is formed on one side of the buffer dielectric layer distal to the base substrate 100.

In step S120, the drive circuit layer 200 may be formed on one side of the base substrate 100. The drive circuit layer 200 may be formed with a plurality of pixel drive circuits, wherein the respective pixel drive circuits are configured to load drive voltages to respective pixel electrodes of the electrode layer 400. Optionally, referring to FIGS. 2 to 3, any of the pixel drive circuits may include the switching transistor 210.

In some embodiments, the switching transistor 210 may be a thin film transistor. The thin film transistor may be a top-gate thin film transistor, a bottom-gate thin film transistor, or a dual-gate thin film transistor. The material of an active layer of the thin film transistor may be an amorphous silicon semiconductor material, a low temperature polycrystalline silicon semiconductor material, a metal oxide semiconductor material, an organic semiconductor material, or other types of semiconductor materials. The thin film transistor may be an N-type or P-type thin film transistor. The present disclosure does not limit the specific type of the thin film transistor.

Optionally, referring to FIGS. 2 to 3, the drive circuit layer 200 may include a semiconductor layer 201, a gate insulating layer 202, a gate electrode layer 203, an interlayer dielectric layer 204 and a source-drain metal layer 205 laminated between the base substrate 100 and the insulating material layer 300. The position relationships of the respective film layers may be determined according to the film layer structure of the thin film transistor. For example, in an embodiment of the present disclosure, the drive circuit layer 200 may include the semiconductor layer 201, the gate insulating layer 202, the gate electrode layer 203, the interlayer dielectric layer 204 and the source-drain metal layer 205 that are sequentially laminated, and the thin film transistor thus formed is the top-gate thin film transistor. For example, in another embodiment of the present disclosure, the drive circuit layer 200 may include the gate electrode layer 203, the gate insulating layer 202, the semiconductor layer 201, the interlayer dielectric layer 204 and the source-drain metal layer 205 laminated in sequence, and the thin film transistor thus formed is the bottom-gate thin film transistor. The drive circuit layer 200 may adopt a double-layer gate structure as well, that is, the gate electrode layer 203 may include a first gate electrode layer and a second gate electrode layer, and the gate insulating layer 202 may include a first gate insulating layer for isolating the semiconductor layer 201 and the first gate electrode layer as well as a second gate insulating layer for isolating the first gate electrode layer and the second gate electrode layer. For example, in an embodiment of the present disclosure, the drive circuit layer 200 may include the semiconductor layer 201, the first gate insulating layer, the first gate electrode layer, the second gate insulating layer, the second gate electrode layer, the interlayer dielectric layer 204 and the source-drain metal layer 205 laminated in sequence on one side of the base substrate 100.

Figure 10:
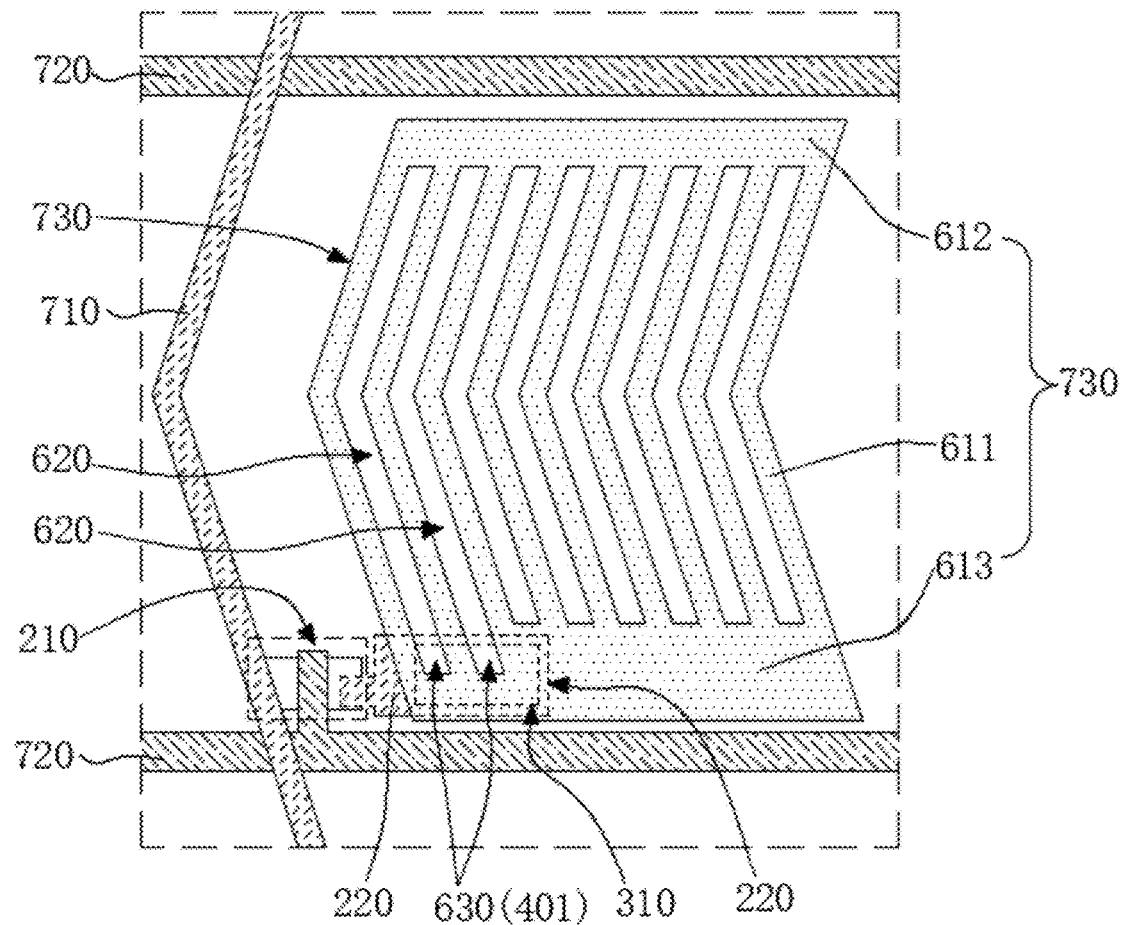
FIG. 10 is a schematic diagram illustrating a position relationship between a second electrode layer and a connection via-hole according to an embodiment of the present disclosure.
Figure 11:
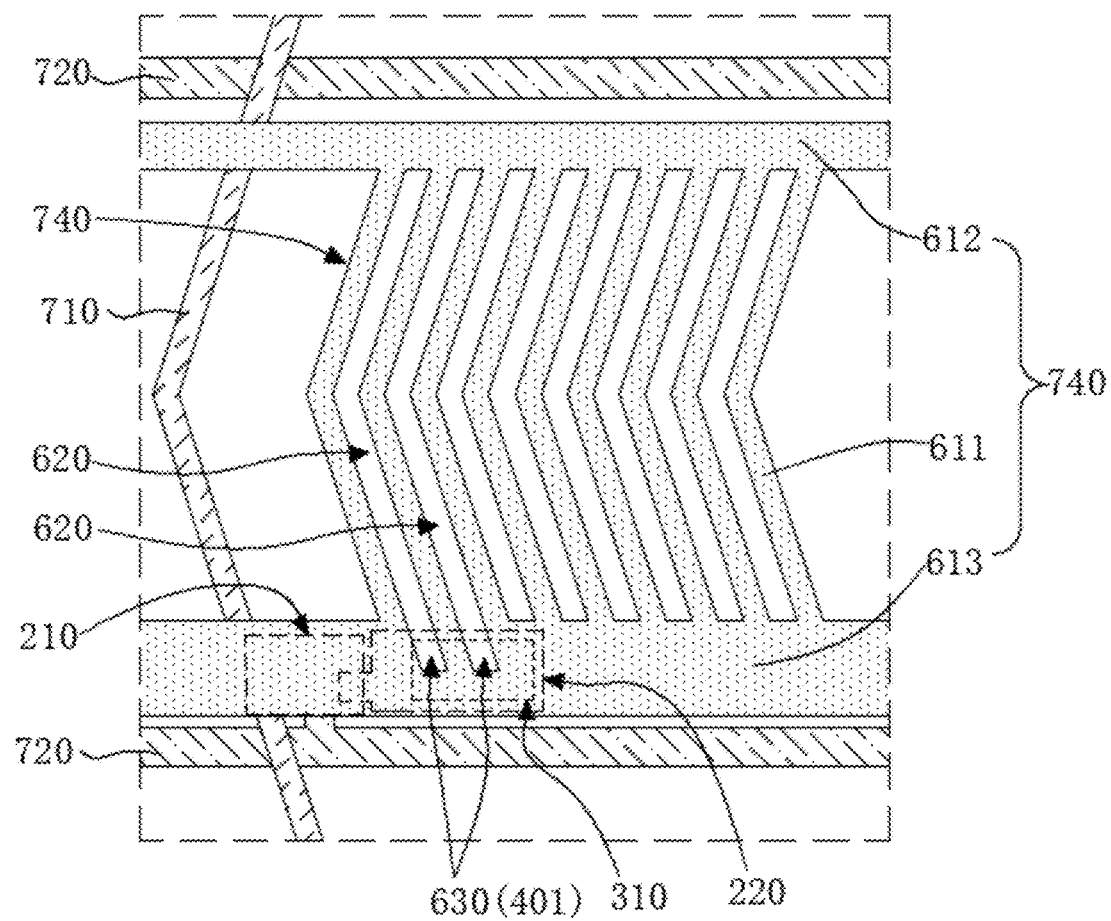
FIG. 11 is a schematic diagram illustrating a position relationship between a second electrode layer and a connection via-hole according to an embodiment of the present disclosure.

Optionally, referring to FIGS. 10 and 11, the drive circuit layer 200 may further include a scan line 720 and a data line 710. The scan line 720 may be located in the gate electrode layer 203 and be electrically connected to a gate electrode of the switching transistor 210. The data line 710 may be disposed in the source-drain metal layer 205 and be electrically connected to a source electrode of the switching transistor 210. A drain electrode 220 of the switching transistor 210 is located in the source-drain metal layer 205 and is electrically connected to a pixel electrode 730 in the electrode layer 400.

In step S130, the insulating material layer 300 may be formed on one side of the drive circuit layer 200 distal to the base substrate 100, wherein the insulating material layer 300 has the connection via-hole 310 exposing at least a part region of the drain electrode 220 of the switching transistor 210. In this way, the pixel electrode 730 may be electrically connected to the drain electrode 220 of the switching transistor 210 through the connection via-hole 310.

Optionally, referring to FIGS. 2 and 3, the insulating material layer 300 may include one or both of a passivation layer 301 and an organic insulating layer 302.

The passivation layer 301 may be provided on a surface of the source-drain metal layer 205 to protect the source-drain metal layer 205. The material of the passivation layer 301 may be an inorganic insulating material such as silicon nitride, silicon oxide or silicon oxynitride, etc. Exemplarily, in an embodiment of the present disclosure, the material of the passivation layer 301 is silicon nitride.

The material of the organic insulating layer 302 may be an organic material, for example, a resin material. Exemplarily, the material of the organic insulating layer 302 may be polyimide. The organic insulating layer 302 may provide a planarized surface for the electrode layer 400 and balance the stress of the array substrate. In addition, the organic insulating layer 302 may reduce parasitic capacitance between the electrode layer 400 and the source-drain metal layer 205, thereby reducing the influence of the parasitic capacitance on the charging rate and the aperture ratio.

Optionally, the organic insulating layer 302 may have a thickness greater than 1.5 microns. In this way, the formed connection via-hole 310 may have a depth greater than 1.5 microns. Exemplarily, the organic insulating layer 302 may have a thickness of 2 to 3 microns.

In an embodiment of the present disclosure, in step S130, the organic insulating layer 302 may be formed on one side of the drive circuit layer 200 distal to the base substrate 100, wherein the organic insulating layer 302 has the connection via-hole 310 exposing at least a part region of the drain electrode of the switching transistor. Thus, the formed insulating material layer 300 includes at least the organic insulating layer 302.

In another embodiment of the present disclosure, in step S130, the formed insulating material layer 300 may include the passivation layer 301 and the organic insulating layer 302 laminated sequentially on one side of the source-drain metal layer 205 distal to the base substrate 100.

Optionally, referring to FIGS. 3-4, the connection via-hole 310 has a bottom opening 312 close to one side of the base substrate 100 and a top opening 311 distal to the one side of the base substrate 100. Side walls of the connection via-hole 310 are located between the bottom opening 312 and the top opening 311. Preferably, referring to FIG. 4, a portion of the groove structure 401 in the connection via-hole 310 is located at the side wall of the connection via-hole 310. In other words, an orthographic projection of the portion of the groove structure 401 in the connection via-hole 310 on the base substrate 100 is located between orthographic projections of the bottom opening 312 and the top opening 311 on the base substrate 100.

Optionally, the size of the opening of the connection via-hole 310 close to the base substrate 100 may be 6 to 15 microns. In other words, the size of the bottom opening of the connection via-hole 310 may be 6 to 15 microns, to ensure a sufficient contact area between the pixel electrodes 730 of the electrode layer 400 and the drain electrode 220 of the switching transistor 210, thus reducing the contact resistance.

Optionally, the connection via-hole 310 has a slope of 45° to 75° such that the size of the top opening 311 of the connection via-hole 310 is larger than that of the bottom opening 312 of the connection via-hole 310. In this way, the connection via-hole 310 may have a proper slope to avoid the break of the electrode layer 400 in the connection via-hole 310 due to a too large slope. The shape of the orthographic projection of the connection via-hole 310 on the base substrate 100 may be a square shape, a rectangular shape, a circular shape, an oval shape or other shapes, and the present disclosure does not impose any limitation on it.

For example, in an embodiment of the present disclosure, the opening of the connection via-hole 310 is in a rectangular shape, the size of the opening of the connection via-hole 310 close to the base substrate 100 in an extension direction of the scan line 720 in the drive circuit layer 200 is 10-12 microns; and the size of the opening of the connection via-hole 310 close to the base substrate 100 in an extension direction of the data line 710 in the drive circuit layer 200 is 6.5-7.5 microns. Further, the organic insulating layer 302 may have a thickness of 2.0 to 2.5 microns. Exemplarily, the organic insulating layer 302 has a thickness of 2.3 microns, the opening of the connection via-hole 310 is in a rectangular shape, the size of the opening of the connection via-hole 310 close to the base substrate 100 in the extension direction of the scan line 720 in the drive circuit layer 200 is 11 microns, and the size of the opening of the connection via-hole 310 close to the base substrate 100 in the extension direction of the data line 710 in the drive circuit layer 200 is 7 microns.

For another example, in another embodiment of the present disclosure, the opening of the connection via-hole 310 has a circular shape, and the opening close to the base substrate 100 has a diameter of 7 to 8 microns. Further, the organic insulating layer 302 may have a thickness of 2.0 to 2.5 microns. Exemplarily, the organic insulating layer 302 has a thickness of 2.3 microns, the opening of the connection via-hole 310 has a circular shape and the opening close to the base substrate 100 has a diameter of 7.5 microns.

For another example, in another embodiment of the present disclosure, the opening of the connection via-hole 310 is in a rectangular shape, the size of the opening of the connection via-hole 310 close to the base substrate 100 is 11.5 to 13.5 microns in the extension direction of the scan line 720 in the drive circuit layer 200, the size of the opening of the connection via-hole 310 close to the base substrate 100 is 10 to 12 microns in the extension direction of the data line 710 in the drive circuit layer 200, and the size of the connection via-hole 310 in the extension direction of the scan line 720 is larger than that of the connection via-hole 310 in the extension direction of the data line 710. Further, the organic insulating layer 302 may have a thickness of 2.0 to 2.5 microns. Exemplarily, the organic insulating layer 302 has a thickness of 2.3 microns, the opening of the connection via-hole 310 is in a rectangular shape, the size of the opening of the connection via-hole 310 close to the base substrate 100 is 12.5 microns in the extension direction of the scan line 720 in the drive circuit layer 200, and the size of the opening of the connection via-hole 310 close to the base substrate 100 is 11 microns in the extension direction of the data line 710 in the drive circuit layer 200.

Optionally, the drain electrode 220 of one switching transistor 210 may have one connection via-hole 310 or a plurality of connection via-holes 310, as long as the electrical connection of the electrode layer to the drain electrode 220 of the switching transistor 210 is guaranteed. In an embodiment of the present disclosure, the drain electrode 220 of one switching transistor 210 has one connection via-hole 310, that is, the connection via-hole 310 is provided in one-to-one correspondence with the drain electrode 220 of the switching transistor 210 and the connection via-hole 310 exposes at least a part region of the drain electrode 220 of the corresponding switching transistor 210.

Optionally, in the step S140, the electrode layer 400 may be formed on one side of the insulating material layer 300 distal to the base substrate 100, wherein the electrode layer 400 includes a first electrode layer 410, an insulating dielectric layer 420 and a second electrode layer 430 laminated sequentially on the one side of the insulating material layer 300.

Optionally, the material of the first electrode layer 410 and the second electrode layer 430 is a transparent conductive material, for example, a transparent metal oxide. Exemplarily, the material of both the first electrode layer 410 and the second electrode layer 430 is indium zinc oxide (ITO). Further, optionally, any one of the first electrode layer 410 and the second electrode layer 430 may have a thickness of 300 to 1300 angstroms. Preferably, any one of the first electrode layer 410 and the second electrode layer 430 may have a thickness of 500 to 1000 angstroms. Exemplarily, any one of the first electrode layer 410 and the second electrode layer 430 may have a thickness of 400 to 700 angstroms.

Optionally, the material of the insulating dielectric layer 420 may be an inorganic insulating material such as silicon oxide, silicon nitride, or silicon oxynitride, etc. In an embodiment of the present disclosure, the material of the insulating dielectric layer 420 may be silicon nitride.

Optionally, referring to FIGS. 2 to 3, a common electrode 740 is disposed in one of the first electrode layer 410 and the second electrode layer 430, and a pixel electrode 730 is disposed in the other one of the first electrode layer 410 and the second electrode layer 430. In this way, the array substrate is formed with sub-pixels arranged in the form of arrays, and one of the sub-pixels includes the pixel electrode 730, the common electrode 740 disposed corresponding to the pixel electrode 730, and the switching transistor 210 electrically connected to the pixel electrode 730. The source electrode of the switching transistor 210 is connected to a data line 710 and the gate electrode of the switching transistor 210 is connected to a scan line 720.

Optionally, the array substrate may further have a via-hole extension region surrounding the top opening of the connection via-hole 310 in the insulating material layer 300, wherein one or two of the first electrode layer 410, the insulating dielectric layer 420 and the second electrode layer 430 may not cover the via-hole extension region, such that the electrode layer 400 is recessed in the direction from the surface of the via-hole extension region to the base substrate 100, to form a ring-shaped recessed region. In this way, the connection via-hole 310 in the present disclosure includes the ring-shaped recessed region, and when the groove structure 401 extends into the ring-shaped recessed region, it means that the groove structure 401 extends into the connection via-hole 310 of the present disclosure.

Exemplarily, in an embodiment of the present disclosure, referring to FIG. 3, the first electrode layer 410 has the common electrode 740, and the first electrode layer 410 and the insulating dielectric layer 420 expose the drain electrode 220 of the switching transistor 210. The second electrode layer 430 has the pixel electrode 730, and the pixel electrode 730 is electrically connected to the drain electrode 220 of the switching transistor 210 through the connection via-hole 310.

Further, the first electrode layer 410 surrounds the connection via-hole 310 on the insulating material layer 300, there is a via-hole extension region between the first electrode layer 410 and the top opening of the connection via-hole 310 on the insulating material layer 300, and no first electrode layer 410 is provided within the via-hole extension region. In this way, when the insulating dielectric layer 420 and the second electrode layer 430 are formed sequentially, the insulating dielectric layer 420 and the second electrode layer 430 are attached on the via-hole extension region along with the shape of the via-hole extension region in sequence, to form the ring-shaped recessed region, and the ring-shaped recessed region is in communication with the connection via-hole 310. In this way, the connection via-hole 310 of the present disclosure is a region within the ring-shaped recessed region. When the groove structure 401 extends into the ring-shaped recessed region, it means that the groove structure 401 extends into the connection via-hole 310 of the present disclosure.

In another embodiment of the present disclosure, referring to FIG. 2, the first electrode layer 410 has the pixel electrode 730 that is electrically connected to the drain electrode 220 of the switching transistor 210 through the connection via-hole 310. The insulating dielectric layer 420 covers the first electrode layer 410, and the second electrode layer 430 has the common electrode 740. The common electrode 740 may or may not cover the connection via-hole 310.

Referring to FIG. 4, when the electrode layer 400 is formed, the groove structure 401 extending to the connection via-hole 310 may be disposed on the surface of the electrode layer 400 distal to the base substrate 100. Thus, the groove structure 401 may guide the orientation liquid to flow into the connection via-hole 310, avoiding poor coating of the orientation layer 500 due to the accumulation of the orientation liquid at the edge of the connection via-hole 310. Further, the groove structure 401 extends at least to the edge of the connection via-hole 310. Preferably, the groove structure 401 extends into the connection via-hole 310.

Optionally, referring to FIG. 4, a plurality of groove structures 401 extend to the same connection via-hole 310. In other words, in any pixel region, the electrode layer 400 may have a plurality of groove structures 401, and the groove structures 401 extend into the same connection via-hole 310. One pixel region may include a region where a pixel electrode 730 is located and a region where the switching transistor 210 to which the pixel electrode 730 is electrically connected is located.

Optionally, the electrode layer 400 is formed such that the groove structure 401 has a depth of 300 to 1300 angstroms. In this way, the groove structure 401 may have a depth of 300 to 1300 angstroms in the formed array substrate, to improve guiding function that the groove structure 401 applies on the orientation liquid. Further, the groove structure 401 may have a depth of 500 to 1000 angstroms. Exemplarily, in some embodiments, the groove structure 401 has a depth of 400 to 700 angstroms.

Optionally, the electrode layer 400 is formed such that the groove structure 401 has a width of 3.0 to 5.0 microns. In this way, the situation that the flow-in of the orientation liquid may not be facilitated because the groove structure 401 is too narrow, may be avoided; and the situation that the synergy of the drainage effect of the two edges of the groove structure 401 will not be facilitated because the groove structure 401 is too wide.

Optionally, the electrode layer 400 is formed such that the groove structure 401 has a length not less than 0.5 microns in the connection via-hole 310. In this way, in the formed array substrate, the groove structure 401 has a length not less than 0.5 microns in the connection via-hole 310, that is, the groove structure 401 extends into the connection via-hole 310 by not less than 0.5 microns. In this way, the orientation liquid may be more effectively guided to flow into the connection via-hole 310 by the groove structure 401, thus improving diffusion uniformity of the orientation liquid. In the embodiment of the present disclosure, the length of the groove structure 401 in the connection via-hole 310 may refer to a length of a portion of an orthographic projection of the groove structure 401 on the base substrate 100 that is located within an orthographic projection of the top opening of the connection via-hole 310 on the base substrate 100. Exemplarily, in an embodiment of the present disclosure, the length of the groove structure 401 in the connection via-hole 310 is 6.25 microns.

Optionally, the electrode layer 400 is formed such that a part of the groove structure 401 outside the connection via-hole 310 has a length of 2.0 to 5.0 microns. In this way, the situation that the part of the groove structure 401 outside the connection via-hole 310 is too short may be avoided, thus ensuring that the groove structure 401 can be in effective communication with the inside and outside of the connection via-hole 310, so as to ensure that the orientation liquid smoothly flows into the groove structure 401 and then into the connection via-hole 310. At the same time, squeezing a light-transmitting region of the display panel due to a too large size of the groove structure 401 outside the connection via-hole 310 can be avoided, thus ensuring a larger aperture ratio of the display panel.

Optionally, when the electrode layer 400 is formed, referring to FIGS. 10 and 11, the second electrode layer 430 may include a plurality of strip sub-electrodes 611 and slits 620 located among the strip sub-electrodes 611, wherein any of the groove structures 401 is in communication with a slit 620. In this way, in the formed array substrate, the second electrode layer 430 includes the plurality of strip sub-electrodes 611 and the slits 620 disposed among the strip sub-electrodes 611, wherein any of the groove structures 401 is in communication with a slit 620. Optionally, the array substrate may be a single-domain array substrate, where the extension of each of the stripe sub-electrodes 611 of the second electrode layer 430 is a straight line segment; and the array substrate may be a dual-domain array substrate as well, where the extension of each of the stripe sub-electrodes 611 of the second electrode layer 430 is a bent line segment. It will be understood that, when the double-domain structure is used such that the stripe sub-electrodes 611 are bent in the plane where the second electrode layer 430 is located, the slits 620 among the stripe sub-electrodes 611 will be bent accordingly as well. The extension direction of the slit 620 refers to the extension direction of an end of the slit 620, for example, the extension direction of one end of the slit 620 close to the groove structure 401.

Optionally, the electrode layer 400 may be formed such that the strip sub-electrode 611 has a width of 2.5 to 3.5 microns, and the slit 620 has a width of 3.0 to 5.0 microns. Further, the ratio of the width of the strip sub-electrode 611 to the width of the slit 620 is 0.5 to 0.8. For example, in an embodiment of the present disclosure, the second electrode layer 430 includes the common electrode 740, the strip sub-electrode 611 has a width of 2.6 microns, and the slit 620 has a width of 4.8 microns. For further example, in another embodiment of the present disclosure, the second electrode layer includes the common electrode 740, the strip sub-electrode 611 has a width of 2.7 microns, and the slit 620 has a width of 3.8 microns. For further example, in another embodiment of the present disclosure, the second electrode layer 430 includes the pixel electrode 730, the strip sub-electrode 611 has a width of 2.8 microns, and the slit 620 has a width of 4.0 microns.

Since the groove structure 401 is in communication with the slit 620, the orientation liquid may flow into the connection via-hole 310 along the slit 620 and the groove structure 401 when the orientation layer 500 is formed, which further improves diffusion uniformity of the orientation liquid. In the present disclosure, the communication of the groove structure 401 with the slit 620 means that the orthographic projection of the groove structure 401 on the base substrate 100 at least partially overlaps or contacts with the orthographic projection of the slit 620 on the base substrate 100.

Further, optionally, the second electrode layer 430 is formed such that the width of the groove structure 401 is the same as that of the slit 620. In this way, the orientation liquid may more smoothly flows into the connection via-hole 310.

Further, optionally, the second electrode layer 430 is formed such that the extension direction of the groove structure 401 is the same as that of the slit 620 that the groove structure 401 communicates. In this way, the orientation liquid may more smoothly flow into the connection via-hole 310.

Further, optionally, the second electrode layer 430 is formed such that an orthographic projection of one end of the groove structure 401 close to the slit 620 on the base substrate 100 overlaps with an orthographic projection of one end of the communicated slit 620 close to the groove structure 401 on the base substrate 100. In this way, the end of the groove structure 401 is aligned with and adjacent to the end of the communicated slit 620, such that the orientation liquid may flow into the groove structure 401 from the slit 620 without adjusting its flow direction.

Preferably, the second electrode layer 430 is formed such that the extension direction of the groove structure 401 is the same as the extension direction of the communicated slit 620, the width of the groove structure 401 is the same as the width of the communicated slit 620, and the orthographic projection of one end of the groove structure 401 close to the slit 620 on the base substrate 100 overlaps with the orthographic projection of one end of the communicated slit 620 close to the groove structure 401 on the base substrate 100. In this way, the groove structure 401 is located at the extension position of the slit 620, which is beneficial to guide the orientation liquid to flow into the connection via-hole 310 along the slit 620 and the groove structure 401.

When the electrode layer 400 is formed, a drainage groove may be provided on the first electrode layer 410, the insulating dielectric layer 420 or the second electrode layer 430, such that the groove structure 401 is formed on the surface of the electrode layer 400.

In some embodiments of the present disclosure, the electrode layer 400 may be formed by using the following method.

Figure 5:
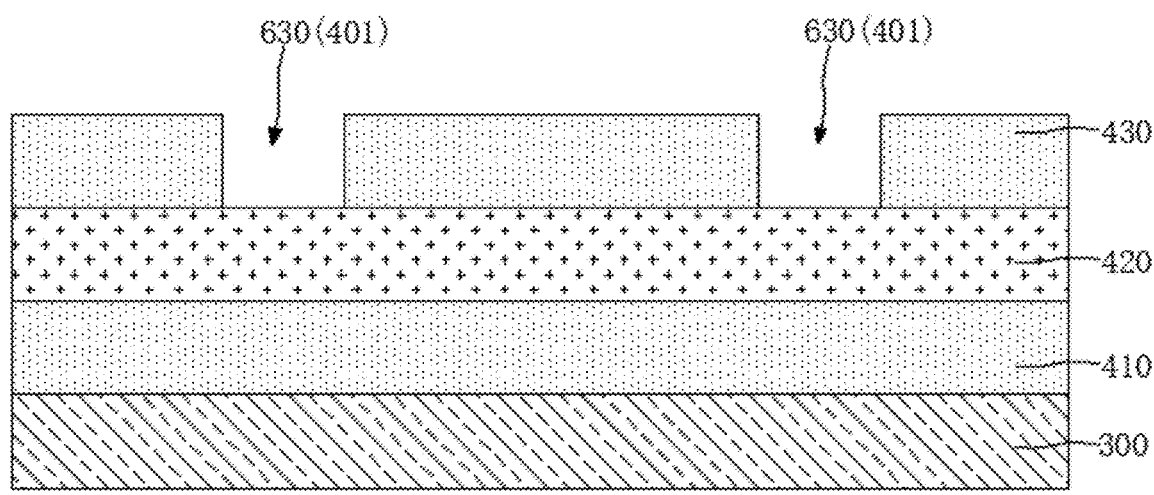
FIG. 5 is a cross-sectional structural schematic diagram of an electrode layer at PP' of FIG. 4 according to an embodiment of the present disclosure.

In step S210, referring to FIG. 5, the first electrode layer 410 is formed on one side of the insulating material layer 300 distal to the base substrate 100.

In step S220, referring to FIG. 5, the insulating dielectric layer 420 is formed on one side of the first electrode layer 410 distal to the base substrate 100.

In step S230, referring to FIG. 5, the second electrode layer 430 is formed on one side of the insulating dielectric layer 420 distal to the base substrate 100, wherein the second electrode layer 430 has a plurality of drainage grooves 630 that extend to the connection via-hole 310, and the drainage grooves 630 form the groove structures 401.

Thus, in step S230, the drainage groove 630 is formed on the second electrode layer 430, and the drainage groove 630 functions as the groove structure 401 of the electrode layer 400 to guide the orientation liquid to flow into the connection via-hole 310.

Preferably, the drainage groove 630 penetrates through the second electrode layer 430 in a direction perpendicular to the base substrate 100. Thus, the depth of the groove structure 401 is equal to the thickness of the second electrode layer 430. When the second electrode layer 430 is formed, the drainage groove 630 may be manufactured simultaneously during the patterning of the second electrode layer 430 without adding additional devices and processes.

In the array substrate manufactured according to steps S210 to S230, the second electrode layer 430 has a plurality of drainage grooves 630 extending to the connection via-hole 310, to enable the electrode layer 400, to form the groove structure 401. Preferably, the depth of the groove structure 401 is equal to the thickness of the second electrode layer 430, that is, the drainage grooves 630 penetrate through the second electrode layer 430 in the direction perpendicular to the base substrate 100.

Optionally, referring to FIGS. 10 and 11, the second electrode layer 430 has the plurality of strip sub-electrodes 611 and slits 620 located among the strip sub-electrodes 611, wherein any of the drainage grooves 630 is in communication with the slit 620. Wherein, further, the width of the drainage groove 630 is the same as the width of the communicated slit 620. Further, the extension direction of the drainage groove 630 is the same as the extension direction of the communicated slit 620. In this way, the array substrate may avoid poor coating of the orientation layer.

In an embodiment of the present disclosure, the drainage groove 630 is in communication with the slit 620, the extension direction of the drainage groove 630 is the same as the extension direction of the communicated slit 620, the width of the drainage groove 630 is the same as the width of the communicated slit 620, the depth of the drainage groove 630 is the same as the depth of the communicated slit 620, and an orthographic projection of one end of the drainage groove 630 close to the slit 620 on the base substrate 100 overlaps with an orthographic projection of one end of the communicated slit 620 close to the drainage groove 630 on the base substrate 100. In this way, the drainage groove 630 may be regarded as the extension of the slit 620 into the connection via-hole 310. In other words, some of the slits 620 of the second electrode layer 430 may extend into the connection via-hole 310, and the parts of the slits 620 extending into the connection via-hole 310 that exceed other adjacent slits 620 may be regarded as the drainage groove 630 of the present disclosure. This may, on the one hand, enable the orientation liquid to smoothly flow into the connection via-hole 310 to overcome poor coating of the orientation layer 500, on the other hand, ensure the uniformity of the second electrode layer 430 as well, thus ensuring display effect of the display panel.

Figure 12:
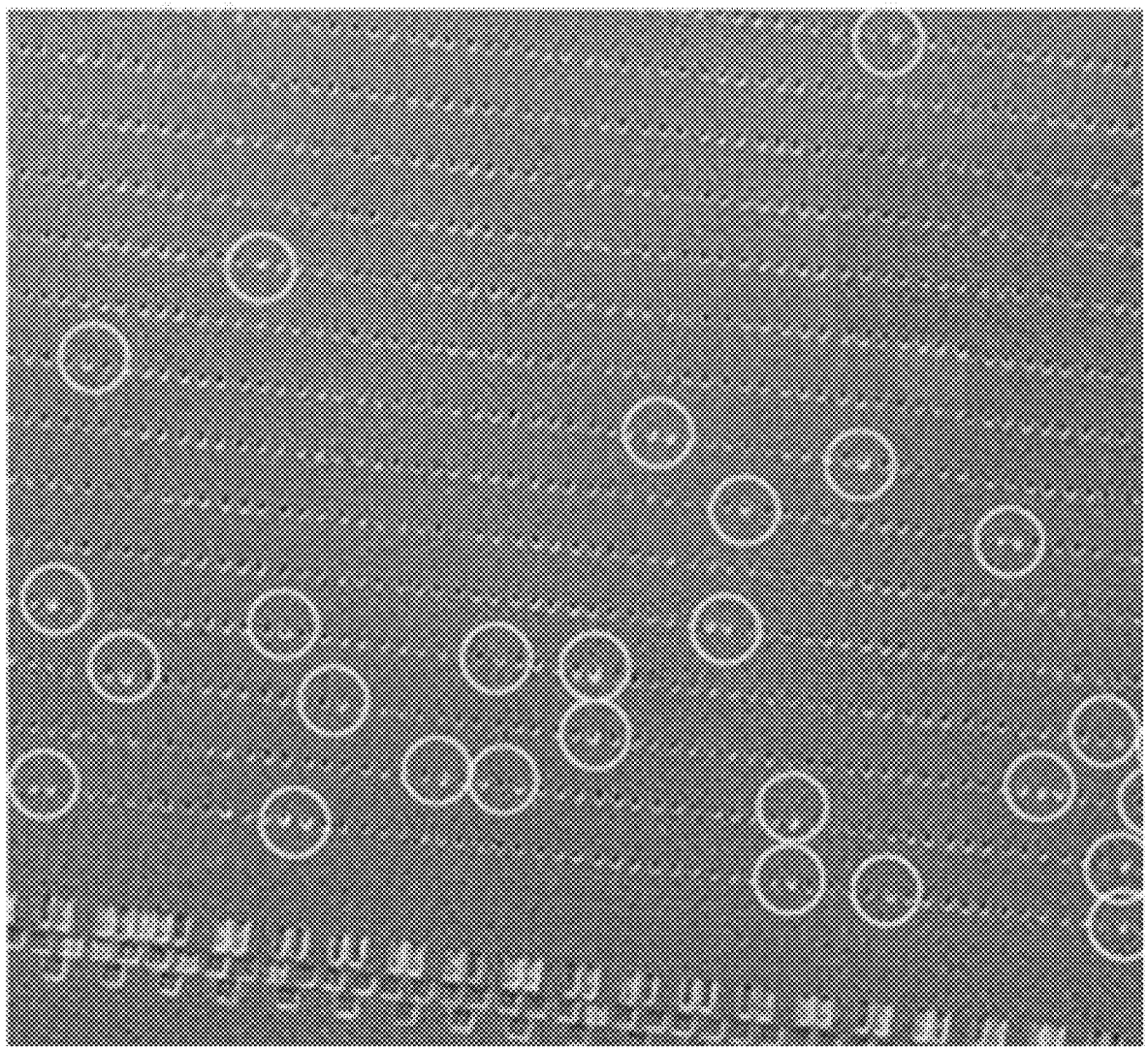
FIG. 12 is a photograph of an array substrate with no groove structure formed thereon after the formation of an orientation layer.
Figure 13:
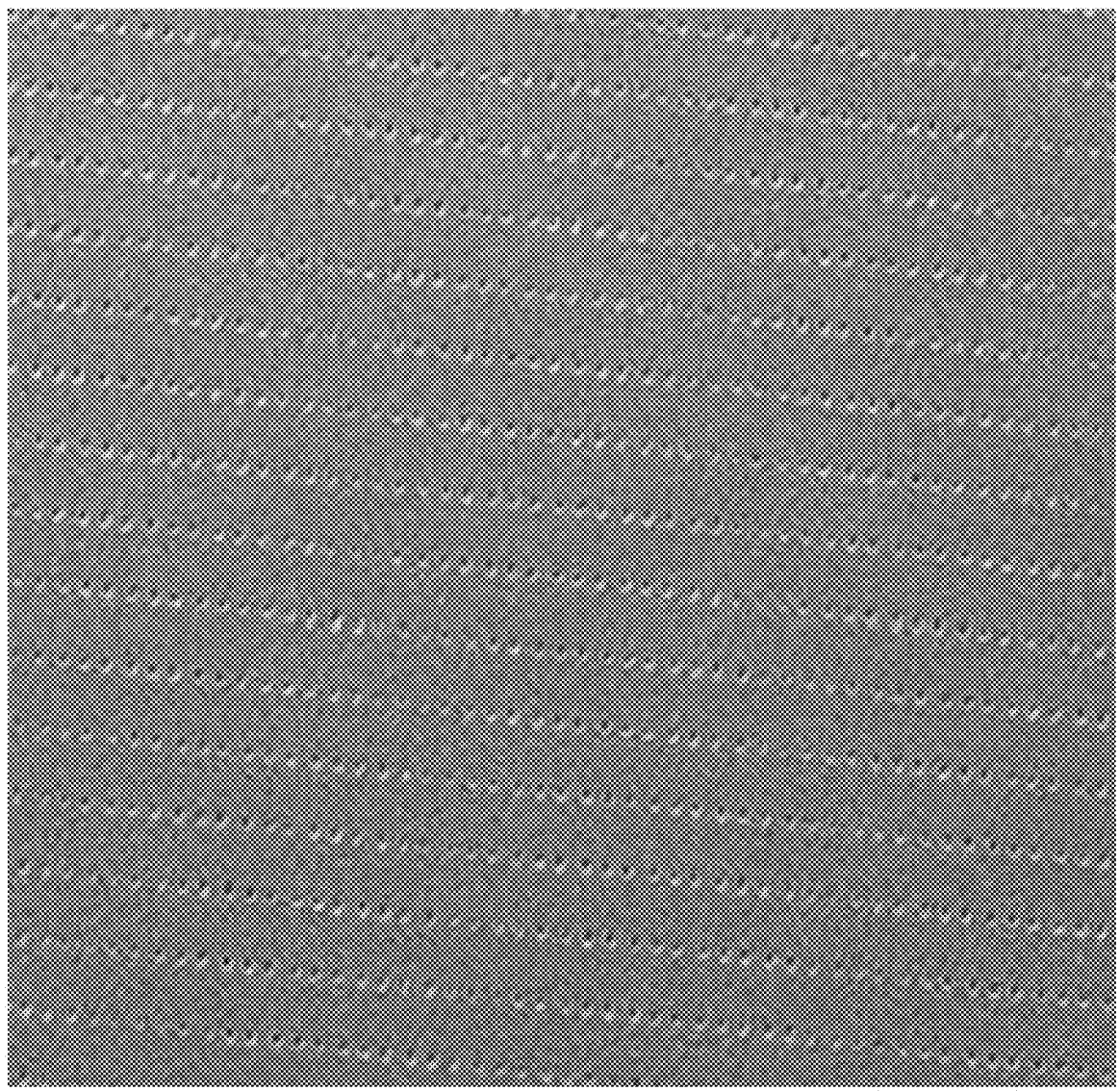
FIG. 13 is a photograph of an array substrate with a groove structure formed thereon after the formation of an orientation layer.

For verification, in the present disclosure, the array substrate provided with the groove structure and the array substrate provided with no groove structure are manufactured and the orientation layers are formed on the two array substrates by a printing manner. FIG. 12 is a photograph of the array substrate with no groove structure formed thereon after the orientation layer is formed. Referring to FIG. 12, the array substrate has a large number of bright spots M. FIG. 13 is a photograph of the array substrate with the groove structure formed thereon after the orientation layer is formed. Referring to FIG. 13, the array substrate has good uniformity without the defect such as bright spots, which indicates the uniform diffusion of the orientation liquid.

In an embodiment, the first electrode layer 410 may include the common electrode 740. Referring to FIG. 10, the second electrode layer 430 may include the pixel electrode 730. The pixel electrode 730 may include a plurality of strip sub-electrodes 611 and slits 620 located among the strip sub-electrodes 611, and may further include a first connection portion 612 and a second connection portion 613. The first connection portion 612 enables, respective ends of the strip sub-electrodes 611 distal to the switching transistor 210 electrically connected to the pixel electrode 730, to be electrically connected to one another, and the second connection portion 613 enables, respective ends of the strip sub-electrodes 611 close to the switching transistor 210 electrically connected to the pixel electrode 730, to be electrically connected to one another. The second connection portion 613 of the pixel electrode 730 is electrically connected to the drain electrode 220 of the switching transistor 210 through the connection via-hole 310, the second connection portion 613 is provided with the drainage groove 630 serving as the groove structure 401, and the drainage groove 630 is in communication with the slit 620 of the pixel electrode 730.

As an example, the opening of the connection via-hole 310 is in a rectangular shape, the size of the opening of the connection via-hole 310 close to the base substrate 100 is 11.5 to 13.5 microns along the extension direction of the scan line 720 in the drive circuit layer 200, the size of the opening of the connection via-hole 310 close to the base substrate 100 along the extension direction of the data line 710 in the drive circuit layer 200 is 10 to 12 microns, and the size of the connection via-hole 310 in the extension direction of the scan line 720 is larger than the size of the connection via-hole 310 in the extension direction of the data line 710. The second electrode layer 430 includes the pixel electrode 730 and covers the connection via-hole 310, and includes a plurality of strip sub-electrodes 611, slits 620 located among the strip sub-electrodes 611 and drainage groove 630 serving as the groove structure 401. The strip sub-electrode 611 has a width of 2.5 to 3.5 microns, and the slit 620 has a width of 3.0 to 5.0 microns. The drainage groove 630 is in communication with the slit 620 and extends into the connection via-hole 310, and a part of the drainage groove 630 within the connection via-hole 310 has a length of 1.5 to 2.5 microns. The drainage groove 630 is the same as the communicated slit 620 in terms of width and extension direction.

For example, the opening of the connection via-hole 310 is in a rectangular shape, the size of the opening of the connection via-hole 310 close to the base substrate 100 along the extension direction of the scan line 720 in the drive circuit layer 200 is 12.5 microns. The size of the opening of the connection via-hole 310 close to the base substrate 100 is 11 microns in the extension direction of the data line 710 in the drive circuit layer 200. The second electrode layer 430 includes the pixel electrode 730 and covers the connection via-hole 310, and the second electrode layer 430 includes a plurality of strip sub-electrodes 611, slits 620 located among the strip sub-electrodes 611, and drainage groove 630 serving as the groove structure 401. The strip sub-electrode 611 has a width of 2.8 microns, and the slit 620 has a width of 4.0 microns. The drainage groove 630 is in communication with the slit 620 and extends into the connection via-hole 310, and a part of the drainage groove 630 within the connection via-hole 310 has a length of 2 microns. The drainage groove 630 is the same as the communicated slit 620 in terms of width and the extension direction.

Further, the first electrode layer 410 surrounds the connection via-hole 310 on the insulating material layer 300, and there is a via-hole extension region between the first electrode layer 410 and the top opening of the connection via-hole 310 on the insulating material layer 300, and no first electrode layer 410 is provided within the via-hole extension region. The insulating dielectric layer 420 and the second electrode layer 430 are attached on the via-hole extension region along with the shape of the via-hole extension region in sequence, to form the ring-shaped recessed region. The connection via-hole 310 of the present disclosure is a region within the ring-shaped recessed region. A part of the groove structure 401 within the connection via-hole 310 is located within the ring-shaped recessed region, and the part of the groove structure 401 within the ring-shaped recessed region has a length of 2 microns.

In an embodiment, the first electrode layer 410 may include the pixel electrode 730, and the pixel electrode 730 is connected to the drain electrode 220 of the switching transistor 210 through the connection via-hole 310. The insulating dielectric layer 420 may cover the pixel electrode 730. Referring to FIG. 11, the second electrode layer 430 may include the common electrode 740. The common electrode 740 may include a plurality of strip sub-electrodes 611 and slits 620 located among the strip sub-electrodes 611, and may further include a first connection portion 612 and a second connection portion 613. The first connection portion 612 enables respective ends of the strip sub-electrodes 611 distal to the switching transistor 210 corresponding to the common electrode 740 to be electrically connected to one another, and the second connection portion 613 enables respective ends of the strip sub-electrodes 611 close to the switching transistor 210 corresponding to the common electrode 740 to be electrically connected to one another. The switching transistor 210 corresponding to the common electrode 740 refers to a switching transistor 210 belonging to the same sub-pixel as the common electrode 740, i.e., a switching transistor 210 electrically connected to the pixel electrode 730 which is located in the same pixel region as the common electrode 740. In the second electrode layer 430, the first connection portions 612 of the common electrodes 740 disposed on the same line may be electrically connected to one another, and the second connection portions 613 of the common electrodes 740 disposed on the same line may be electrically connected to one another. In this way, the uniformity of the common electrodes 740 may be ensured. The second connection portion 613 of the common electrode 740 may cover the connection via-hole 310, the second connection portion 613 is provided with the drainage groove 630 serving as the groove structure 401, and the drainage groove 630 is in communication with the slit 620 of the common electrode 740.

As an example, the opening of the connection via-hole 310 is in a rectangular shape. The size of the opening of the connection via-hole 310 close to the base substrate 100 is 10 to 12 microns in the extension direction of the scan line 720 in the drive circuit layer 200. The size of the opening of the connection via-hole 310 close to the base substrate is 6.5 to 7.5 microns in the extension direction of the data line 710 in the drive circuit layer 200. The second electrode layer 430 includes the common electrode 740 and covers the connection via-hole 310, and the second electrode layer 430 includes a plurality of strip sub-electrodes 611, slits 620 located among the strip sub-electrodes 611, and drainage grooves 630 serving as the groove structures 401. The strip sub-electrode 611 has a width of 2.5 to 3.5 microns, and the slit 620 has a width of 3.0 to 5.0 microns. The drainage groove 630 is in communication with the slit 620 and extends into the connection via-hole 310, and the length of a part of the drainage groove 630 within the connection via-hole 310 is 6.0 to 6.5 microns. The drainage groove 630 and the communicated slit 620 have the same width and extension direction.

For example, the opening of the connection via-hole 310 is in a rectangular shape. The size of the opening of the connection via-hole 310 close to the base substrate 100 is 11 microns in the extension direction of the scan line 720 in the drive circuit layer 200. The size of the opening of the connection via-hole 310 close to the base substrate is 7 microns in the extension direction of the data line 710 in the drive circuit layer 200. The second electrode layer 430 includes the common electrode 740 and covers the connection via-hole 310, and the second electrode layer 430 includes a plurality of strip sub-electrodes 611, slits 620 located among the strip sub-electrodes 611, and drainage grooves 630 serving as the groove structure 401. The strip sub-electrode 611 has a width of 2.6 microns, and the slit 620 has a width of 4.8 microns. The drainage groove 630 is in communication with the slit 620 and extends into the connection via-hole 310, and a part of the drainage groove 630 within the connection via-hole 310 has a length of 6.25 microns. The drainage groove 630 and the communicated slit 620 have the same width and extension direction.

As another example, the opening of the connection via-hole 310 has a circular shape, and the opening close to the base substrate has a diameter of 7 to 8 microns. The second electrode layer 430 has the common electrode 740 and covers the connection via-hole 310, and the second electrode layer 430 includes a plurality of strip sub-electrodes 611, slits 620 located among the strip sub-electrodes 611, and drainage groove 630 serving as the groove structure 401. The strip sub-electrode 611 has a width of 2.5 to 3.5 microns, and the slit 620 has a width of 3.0 to 5.0 microns. The drainage groove 630 is in communication with the slit 620 and extends into the connection via-hole 310, and the length of a part of the drainage groove 630 within the connection via-hole 310 is 0.8 to 1.2 microns. The drainage groove 630 and the communicated slit 620 have the same width and extension direction.

For example, the opening of the connection via-hole 310 has a circular shape, and the opening close to the base substrate has a diameter of 7.5 microns. The second electrode layer 430 has the common electrode 740 and covers the connection via-hole 310, and the second electrode layer 430 includes a plurality of strip sub-electrodes 611, slits 620 located among the strip sub-electrodes 611, and drainage groove 630 serving as the groove structure 401. The strip sub-electrode 611 has a width of 2.7 microns, and the slit 620 has a width of 3.8 microns. The drainage groove 630 is in communication with the slit 620 and extends into the connection via-hole 310. A part of the drainage groove 630 within the connection via-hole 310 has a length of 1 micron. The drainage groove 630 and the communicated slit 620 have the same width and extension direction.

In some other embodiments of the present disclosure, the electrode layer 400 may be formed by using the following method.

Figure 6:
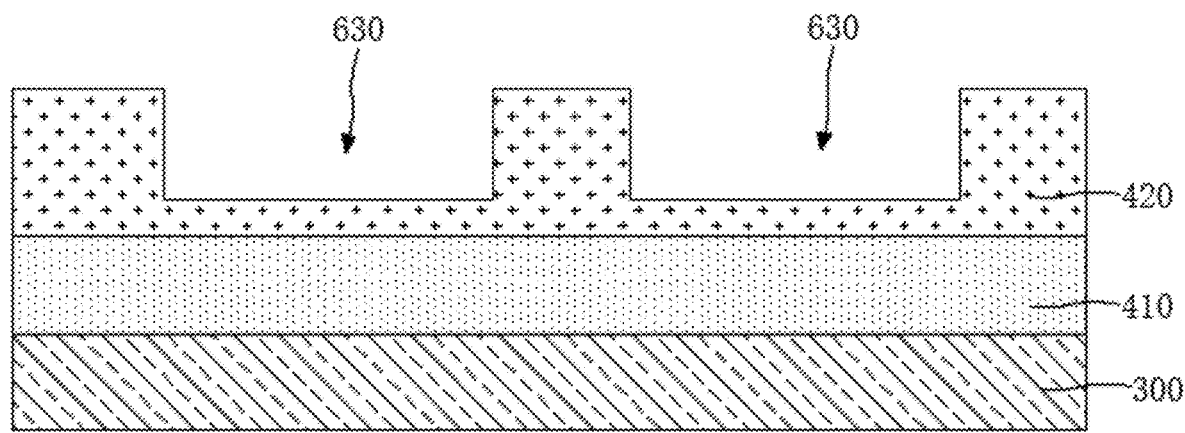
FIG. 6 is a cross-sectional structural schematic diagram of an insulating dielectric layer at PP' of FIG. 4 according to an embodiment of the present disclosure.

In step S310, referring to FIG. 6, the first electrode layer 410 is formed on one side of the insulating material layer 300 distal to the base substrate 100.

In step S320, referring to FIG. 6, the insulating dielectric layer 420 is formed on one side of the first electrode layer 410 distal to the base substrate 100, wherein the insulating dielectric layer 420 has a plurality of drainage grooves 630 extending to the connection via-hole 310.

Figure 7:
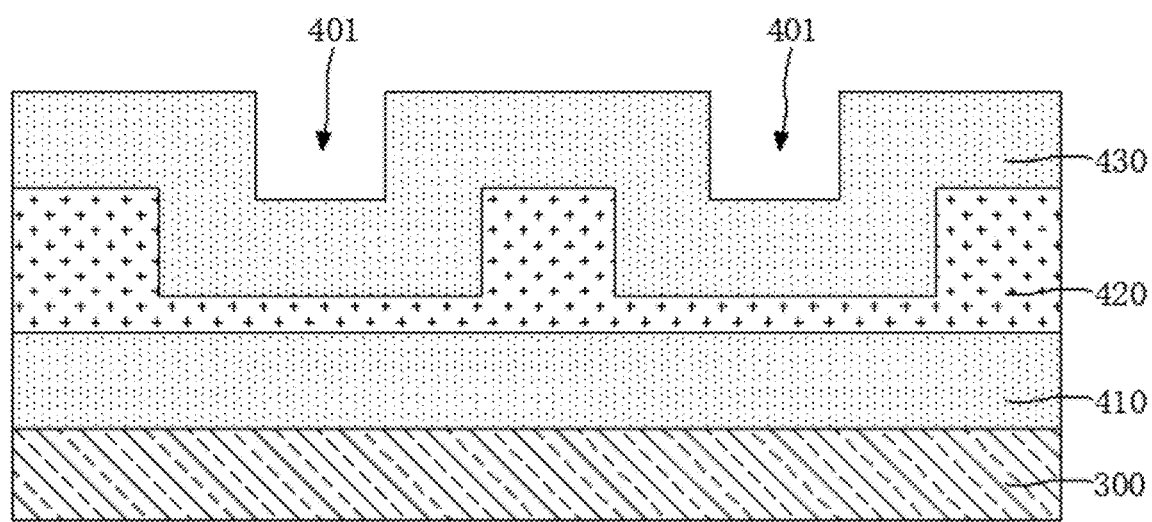
FIG. 7 is a cross-sectional structural schematic diagram of an electrode layer at PP' of FIG. 4 according to an embodiment of the present disclosure.

In step S330, referring to FIG. 7, the second electrode layer 430 is formed on one side of the insulating dielectric layer 420 distal to the base substrate 100, wherein the second electrode layer 430 covers the side wall and bottom of the drainage groove 630, to form the groove structure 401.

In this way, when the second electrode layer 430 is formed, the second electrode layer 430 may cover the side wall and bottom of the drainage groove 630 such that the surface of the second electrode layer 430 forms the groove structure 401 in the region where the drainage groove 630 is located. In the formed electrode layer 400, the insulating dielectric layer 420 has a plurality of drainage slots 630 extending to the connection via-hole 310, and the second electrode layer 430 is bent inwardly into the drainage grooves 630, to form the groove structure 401, wherein an orthographic projection of the groove structure 401 on the insulating dielectric layer 420 is located in the drainage grooves 630.

Optionally, in step S320, the insulating dielectric material layer may be formed on one side of the first electrode layer 410 distal to the base substrate 100 by a deposition manner, and then the insulating dielectric material layer may be patterned to expose the drain electrode 220 of the switching transistor 210 and to form the groove structure 401 that is in communication with the connection via-hole 310. Exemplarily, a first photoresist layer may be formed on a surface of the insulating dielectric material layer distal to the base substrate 100, and then the first photoresist layer is exposed and developed by using grayscale exposure techniques, to form a patterned second photoresist layer. The second photoresist layer exposes the insulating dielectric material layer in a first region which covers at least the bottom of the connection via-hole 310, the thickness of the second photoresist layer in a second region is a first thickness and the second region is a region where the drainage groove 630 is to be formed, the second photoresist layer has a second thickness in a third region, the third region covers the pixel region, and the second thickness is greater than the first thickness. Then, the insulating dielectric material layer is etched in the first region to expose the drain electrode 220 of the switching transistor 210. Then, the second photoresist layer is ashed such that the insulating dielectric material layer is exposed in the second region and the third region is still covered with photoresist. Then, the insulating dielectric material layer is etched in the second region, to form the drainage groove 630 that is in communication with the connection via-hole 310. The residual photoresist is removed.

Optionally, in step S330, a second electrode material layer may be formed on one side of the insulating dielectric layer 420 distal to the base substrate 100 by a deposition manner, and then the second electrode material layer is patterned, to form the second electrode layer 430. In this way, planarizing the drainage groove 630 may be avoided, such that the groove structure formed by the drainage groove 630 to be preserved, which in turn allows the groove structure 401 to be formed on the surface of the electrode layer 400 distal to the base substrate 100.

In some other embodiments of the present disclosure, the electrode layer 400 may be formed by using the following method.

Figure 8:
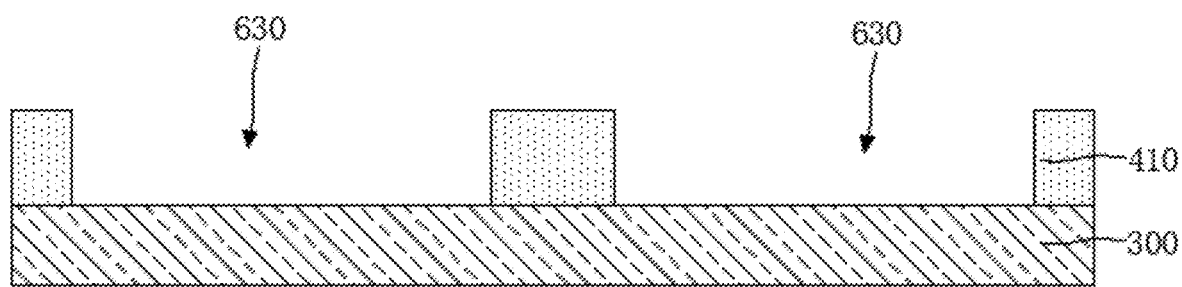
FIG. 8 is a cross-sectional structural schematic diagram of a first electrode layer at PP' of FIG. 4 according to an embodiment of the present disclosure.

In step S410, referring to FIG. 8, the first electrode layer 410 is formed on one side of the insulating material layer 300 distal to the base substrate 100, wherein the first electrode layer 410 has a plurality of drainage grooves 630 which extend to the connection via-hole 310.

Figure 9:
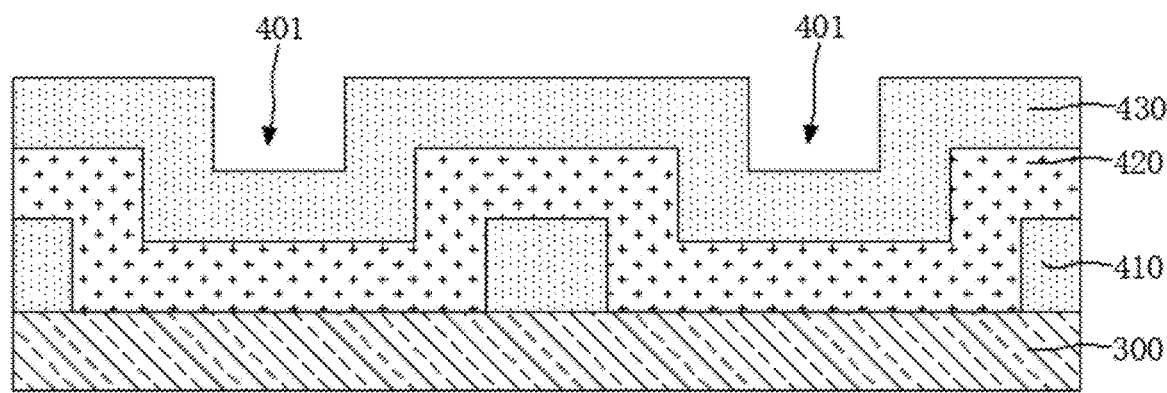
FIG. 9 is a cross-sectional structural schematic diagram of an electrode layer at PP' of FIG. 4 according to an embodiment of the present disclosure.

In step S420, referring to FIG. 9, the insulating dielectric layer 420 is formed on one side of the first electrode layer 410 distal to the base substrate 100.

In step S430, referring to FIG. 9, the second electrode layer 430 is formed on one side of the insulating dielectric layer 420 distal to the base substrate 100, wherein the insulating dielectric layer 420 and the second electrode layer 430 sequentially cover the side wall and bottom of the drainage groove 630, to form the groove structure 401.

In this way, in step S410, the first electrode layer 410 may be formed with the drainage groove 630 extending to the connection via-hole 310, and the recess structure formed by the drainage groove 630 may cause the insulating dielectric layer 420 and the second electrode layer 430 to form a recess, to form the groove structure 401. In the formed electrode layer 400, the first electrode layer 410 has a plurality of drainage grooves 630 extending to the connection via-hole 310, the insulating dielectric layer 420 and the second electrode layer 430 cover the bottom and side walls of the drainage groove 630, to form the groove structure 401, and an orthographic projection of the groove structure 401 on the first electrode layer 410 is located in the drainage grooves 630.

Optionally, in step S420, the insulating dielectric material layer may be formed by a deposition manner, and undergo a patterning operation, to form the insulating dielectric layer 420. In step S430, the second electrode material layer may be formed by a deposition manner, and undergo a patterning operation, to form the second electrode layer 430. Thus, the insulating dielectric layer 420 and the second electrode layer 430 will not planarize the drainage groove 630, such that the insulating dielectric layer 420 and the second electrode layer 430 form the groove structure 401 along with the shape of the drainage groove 630.

In other embodiments of the present disclosure, other methods may be used for the formation of the groove structure 401 by the electrode layer 400, for example, the insulating material layer 300 forms the drainage groove in communication with the connection via-hole 310 such that the electrode layer 400 forms the groove structure 401. Other feasible methods will not be elaborated in the present disclosure.

Optionally, the method of manufacturing the array substrate of the present disclosure may further include:

In step S150, the orientation liquid may be coated on one side of the electrode layer 400 distal to the base substrate 100, and the orientation layer 500 is then formed. In this step, the orientation liquid can flow into the connection via-hole 310 along the groove structure 401, to not only fill the connection via-hole 310 but also avoid the accumulation of the orientation liquid near the connection via-hole 310, which improves the diffusion uniformity of the orientation liquid, then avoids poor coating of the orientation layer 500.

Optionally, the orientation liquid may be cured by a light curing manner, to form the orientation layer 500. Exemplarily, an optical alignment device may be used such that the orientation liquid is cured into the orientation layer 500 with a predetermined orientation. The orientation layer 500 may be formed by the orientation liquid by using other manners, for example, formed by using a friction manner after the orientation liquid is cured such that the orientation layer 500 has a predetermined orientation.

The present disclosure further provides an array substrate. Referring to FIGS. 2 to 4, the array substrate includes:

the base substrate 100;

the drive circuit layer 200, disposed on one side of the base substrate 100, and including the switching transistor 210;

the insulating material layer 300, disposed on one side of the drive circuit layer 200 distal to the base substrate 100, and having the connection via-hole 310 exposing at least a part region of the drain electrode 220 of the switching transistor 210; and the electrode layer 400, disposed on one side of the insulating material layer 300 distal to the base substrate 100, wherein the surface of the electrode layer 400 distal to the base substrate 100 has the groove structure 401 extending to the connection via-hole 310.

The array substrate provided by the present disclosure may be manufactured by any of the methods of manufacturing the array substrate described in the embodiments of the above-described methods of manufacturing the array substrate, and therefore has the same or similar technical effect, which will not be elaborated herein by the present disclosure.

In an embodiment of the present disclosure, the electrode layer 400 includes the first electrode layer 410, the insulating dielectric layer 420 and the second electrode layer 430 that are sequentially laminated on one side of the insulating material layer 300 distal to the base substrate 100.

In an embodiment of the present disclosure, the insulating material layer 300 includes the organic insulating layer 302, and the organic insulating layer 302 has the connection via-hole 310 that exposes at least a part region of the drain electrode 220 of the switching transistor 210.

In an embodiment of the present disclosure, the array substrate further includes the orientation layer 500, and the orientation layer 500 is provided on one side of the electrode layer 400 distal to the base substrate 100.

In an embodiment of the present disclosure, the groove structure 401 has a depth of 300 to 1300 angstroms.

In an embodiment of the present disclosure, the depth of the groove structure 401 is equal to the thickness of the second electrode layer 430.

In an embodiment of the present disclosure, the groove structure 401 extends at least to the edge of the connection via-hole 310.

In an embodiment of the present disclosure, the length of a part of the groove structure 401 with the connection via-hole 310. is not less than 0.5 microns In an embodiment of the present disclosure, a part of the groove structure 401 with the connection via-hole 310 is located on the sidewall of the connection via-hole 310.

In an embodiment of the present disclosure, the length of a part of the groove structure 401 outside the connection via-hole 310 is 2.0~5.0 microns.

In an embodiment of the present disclosure, the width of the groove structure 401 is 3.0~5.0 microns.

In an embodiment of the present disclosure, the second electrode layer 430 includes a plurality of strip sub-electrodes 611 and slits 620 located among the strip sub-electrodes 611, the strip sub-electrode 611 has a width of 2.5~3.5 microns, and the slit 620 has a width of 3.0~5.0 microns.

In an embodiment of the present disclosure, the ratio of the width of the strip sub-electrode 611 to the width of the slit 620 is 0.5 to 0.8.

In an embodiment of the present disclosure, referring to FIGS. 10 and 11, the second electrode layer 430 includes a plurality of strip sub-electrodes 611 and slits 620 located among the strip sub-electrodes 611, and any of the groove structures 401 is in communication with one of the slits 620.

In an embodiment of the present disclosure, referring to FIGS. 10 and 11, the width of the groove structure 401 is the same as the width of the communicated slit 620.

In an embodiment of the present disclosure, referring to FIGS. 10 and 11, the extension direction of the groove structure 401 is the same as that of the communicated slit 620.

In an embodiment of the present disclosure, referring to FIGS. 10 and 11, an orthographic projection of one end of the groove structure 401 close to the slit 620 on the base substrate 100, overlaps an orthographic projection of one end of the communicated slit 620 close to the groove structure 401 on the base substrate 100.

In an embodiment of the present disclosure, referring to FIG. 5, the second electrode layer 430 has a plurality of drainage grooves 630 extending to the connection via-hole 310, and the drainage grooves 630 are used as the groove structures 401 of the electrode layer 400.

In an embodiment of the present disclosure, referring to FIGS. 6 and 7, the insulating dielectric layer 420 has a plurality of drainage grooves 630 extending to the connection via-hole 310, the second electrode layer 430 is bent inwardly into the drainage groove 630, to form the groove structure 401, and an orthographic projection of the groove structure 401 on the insulating dielectric layer 420 is located within the drainage groove 630.

In an embodiment of the present disclosure, referring to FIGS. 8 and 9, the first electrode layer 410 has a plurality of drainage grooves 630 extending to the connection via-hole 310, and the insulating dielectric layer 420 and the second electrode layer 430 cover the bottom and side walls of the drainage groove 630, to form the groove structure 401. An orthographic projection of the groove structure 401 on the first electrode layer 410 is located within the drainage groove 630.

In an embodiment of the present disclosure, the opening of the connection via-hole 310 is in a rectangular shape, the opening of the connection via-hole 310 is in a rectangular shape in the extension direction of the scan line 720 in the drive circuit layer 200. The size of the opening of the connection via-hole 310 close to the base substrate 100 is 10 to 12 microns in the extension direction of the scan line 720 in the drive circuit layer 200. The size of the opening of the connection via-hole 310 close to the base substrate is 6.5 to 7.5 microns in the extension direction of the data line 710 in the drive circuit layer 200. The second electrode layer 430 includes the common electrode 740 and covers the connection via-hole 310, and the second electrode layer 430 includes a plurality of strip sub-electrodes 611, slits 620 located among the strip sub-electrodes 611, and drainage grooves 630 serving as the groove structures 401. The strip sub-electrode 611 has a width of 2.5 to 3.5 microns, and the slit 620 has a width of 3.0 to 5.0 microns. The drainage groove 630 is in communication with the slit 620 and extends into the connection via-hole 310, and the length of a part of the drainage groove 630 within the connection via-hole 310 is 6.0 to 6.5 microns. The drainage groove 630 and the communicated slit 620 have the same width and extension direction.

In an embodiment of the present disclosure, the opening of the connection via-hole 310 has a circular shape, and the opening close to the base substrate has a diameter of 7 to 8 microns. The second electrode layer 430 has the common electrode 740 and covers the connection via-hole 310, and the second electrode layer 430 includes a plurality of strip sub-electrodes 611, slits 620 located among the strip sub-electrodes 611, and drainage grooves 630 serving as the groove structures 401. The strip sub-electrode 611 has a width of 2.5 to 3.5 microns, and the slit 620 has a width of 3.0 to 5.0 microns. The drainage groove 630 is in communication with the slit 620 and extends into the connection via-hole 310, and the length of a part of the drainage groove 630 within the connection via-hole 310 is 0.8 to 1.2 microns. The drainage groove 630 and the communicated slit 620 have the same width and extension direction.

In an embodiment of the present disclosure, the opening of the connection via-hole 310 is in a rectangular shape, the size of the opening of the connection via-hole 310 close to the base substrate 100 is 11.5 to 13.5 microns in the extension direction of the scan line 720 in the drive circuit layer 200, the size of the opening of the connection via-hole 310 close to the base substrate 100 is 10 to 12 microns in the extension direction of the data line 710 in the drive circuit layer 200, and the size of the connection via-hole 310 in the extension direction of the scan line 720 is larger than that of the connection via-hole 310 in the extension direction of the data line 710. The second electrode layer 430 includes the pixel electrode 730 and covers the connection via-hole 310, and includes a plurality of strip sub-electrodes 611, slits 620 located among the strip sub-electrodes 611, and drainage grooves 630 serving as the groove structures 401. The strip sub-electrode 611 has a width of 2.5 to 3.5 microns, and the slit 620 has a width of 3.0 to 5.0 microns. The drainage groove 630 is in communication with the slit 620 and extends into the connection via-hole 310, and the length of a part of the drainage groove 630 within the connection via-hole 310 is 1.5 to 2.5 microns. The drainage groove 630 and the communicated slit 620 have the same width and extension direction.

Further, the first electrode layer 410 surrounds the connection via-hole 310 on the insulating material layer 300 and there is a via-hole extension region between the first electrode layer 410 and the top opening of the connection via-hole 310 on the insulating material layer 300, and no first electrode layer 410 is provided within the via-hole extension region. The insulating dielectric layer 420 and the second electrode layer 430 are attached on the via-hole extension region along with the shape of the via-hole extension region in sequence, to form the ring-shaped recessed region. The connection via-hole 310 of the present disclosure is a region within the ring-shaped recessed region. A part of the groove structure 401 within the connection via-hole 310 is located within the ring-shaped recessed region, and the part of the groove structure 401 within the ring-shaped recessed region has a length of 2 microns.

Other details and effects of the array substrate of the present disclosure have been described in detail in the embodiments of the above-described method of manufacturing the array substrate, or can be reasonably deduced from what is recorded in the embodiments of the above-described method of manufacturing the array substrate, which will not be elaborated herein.

Embodiments of the present disclosure further provide a display panel that includes any of the array substrates described in the embodiments of the above-mentioned array substrate. The display panel may be a computer screen, a television screen, a cell phone screen, or other types of liquid crystal display panels. Since the display panel has any of the array substrates described in the embodiments of the above-mentioned array substrate, thus has the same beneficial effect, which will not be elaborated herein.

It shall be understood that the present disclosure does not limit its application to the detailed structures and arrangements of the components presented in this specification. The present disclosure can have other embodiments and can be implemented and carried out in a variety of ways. The foregoing variations and modifications fall within the scope of the present disclosure. It shall be understood that the present disclosure as disclosed and limited by this specification extends to all alternative combinations of two or more individual features mentioned or apparent in the text and/or the accompanying drawings. All such different combinations constitute a plurality of alternative aspects of the present disclosure. Embodiments of this specification illustrate the best mode known for implementing the present disclosure and will enable those skilled in the art to make use of the present disclosure.

What is claimed is:

1. A method of manufacturing an array substrate, comprising:
  providing a base substrate;
  forming a drive circuit layer on the base substrate, wherein the drive circuit layer comprises a switching transistor;

forming an insulating material layer on one side of the drive circuit layer distal to the base substrate, wherein the insulating material layer has a connection via-hole exposing at least a part region of a drain electrode of the switching transistor; and forming an electrode layer on one side of the insulating material layer distal to the base substrate by sequentially forming a first electrode layer, an insulating dielectric layer and a second electrode layer which are laminated on one side of the insulating material layer distal to the base substrate, wherein the electrode layer is formed such that the second electrode layer comprises a plurality of strip sub-electrodes and slits located among the strip sub-electrodes;

wherein a surface of the electrode layer distal to the base substrate has at least one groove structure extending to the connection via-hole; and wherein any one of the groove structures is in communication with one of the slits, and the second electrode layer is formed such that a width of the groove structure is the same as a width of the communicated slit.

2. The method of manufacturing the array substrate according to claim 1, wherein the step of forming the insulating material layer on one side of the drive circuit layer distal to the base substrate comprises:

forming an organic insulating layer on one side of the drive circuit layer distal to the base substrate, wherein the organic insulating layer has the connection via-hole exposing at least the part region of the drain electrode of the switching transistor.

3. The method of manufacturing the array substrate according to claim 1, wherein the second electrode layer is formed such that an extension direction of the groove structure is the same as an extension direction of the communicated slit.

4. The method of manufacturing the array substrate according to claim 1, wherein the step of forming the electrode layer on one side of the insulating material layer distal to the base substrate comprises:

forming the first electrode layer on one side of the insulating material layer distal to the base substrate;
forming the insulating dielectric layer on one side of the first electrode layer distal to the base substrate; and
forming the second electrode layer on one side of the insulating dielectric layer distal to the base substrate, wherein the second electrode layer has drainage grooves, and the drainage grooves extend to the connection via-hole, to serve as the groove structures.

5. The method of manufacturing the array substrate according to claim 1, wherein the step of forming the electrode layer on one side of the insulating material layer distal to the base substrate comprises:

forming the first electrode layer on one side of the insulating material layer distal to the base substrate;
forming the insulating dielectric layer on one side of the first electrode layer distal to the base substrate, wherein the insulating dielectric layer has a plurality of drainage grooves extending to the connection via-hole; and
forming the second electrode layer on one side of the insulating dielectric layer distal to the base substrate, wherein the second electrode layer covers side walls and a bottom of the drainage groove, to form the groove structure.

6. The method of manufacturing the array substrate according to claim 1, wherein the step of forming the electrode layer on one side of the insulating material layer distal to the base substrate comprises:

forming the first electrode layer on one side of the insulating material layer distal to the base substrate, wherein the first electrode layer has a plurality of drainage grooves, and the drainage grooves extend to the connection via-hole;
forming the insulating dielectric layer on one side of the first electrode layer distal to the base substrate; and
forming the second electrode layer on one side of the insulating dielectric layer distal to the base substrate,
wherein the insulating dielectric layer and the second electrode layer sequentially cover side walls and a bottom of the drainage groove, to form the groove structure.

7. An array substrate, comprising:
a base substrate;
a drive circuit layer, disposed on one side of the base substrate and comprising a switching transistor;
an insulating material layer, disposed on one side of the drive circuit layer distal to the base substrate, and having a connection via-hole exposing at least a part region of a drain electrode of the switching transistor; and
an electrode layer, disposed on one side of the insulating material layer distal to the base substrate, wherein a surface of the electrode layer distal to the base substrate has at least one groove structure extending to the connection via-hole;
wherein the electrode layer comprises a first electrode layer, an insulating dielectric layer and a second electrode layer sequentially laminated on one side of the insulating material layer distal to the base substrate;
wherein the second electrode layer comprises a plurality of strip sub-electrodes and slits located among the strip sub-electrodes, wherein any one of the groove structures is in communication with one of the slits; and
wherein a width of the groove structure is the same as a width of the communicated slit.

8. The array substrate according to claim 7, wherein the insulating material layer comprises an organic insulating layer, and the organic insulating layer has the connection via-hole exposing at least the part region of the drain electrode of the switching transistor.

9. The array substrate according to claim 7, wherein the second electrode layer has a plurality of drainage grooves extending to the connection via-hole, and the drainage grooves serves as the groove structures of the electrode layer.

10. The array substrate according to claim 7, wherein the insulating dielectric layer has a plurality of drainage grooves extending to the connection via-hole, the second electrode layer is bent inwardly into the drainage groove, to form the groove structure, and an orthographic projection of the groove structure on the insulating dielectric layer is located within the drainage groove.

11. The array substrate according to claim 7, wherein the first electrode layer has a plurality of drainage grooves extending to the connection via-hole, the insulating dielectric layer and the second electrode layer cover a bottom and side walls of the drainage groove, to form the groove structure, and an orthographic projection of the groove structure on the first electrode layer is located within the drainage groove.

12. The array substrate according to claim 7, wherein the groove structure has a depth of 300 to 1300 angstroms.

13. The array substrate according to claim 7, wherein a depth of the groove structure is equal to a thickness of the second electrode layer.

14. The array substrate according to claim 7, wherein a length of a part of the groove structure within the connection via-hole is not less than 0.5 microns.

15. The array substrate according to claim 7, wherein a part of the groove structure within the connection via-hole is located on a side wall of the connection via-hole.

16. The array substrate according to claim 7, wherein a length of a part of the groove structure outside the connection via-hole is 2.0~5.0 microns.

17. The array substrate according to claim 7, wherein an extension direction of the groove structure is the same as an extension direction of the communicated slit.

18. The array substrate according to claim 7, wherein an orthographic projection of one end of the groove structure close to the slit on the base substrate overlaps with an orthographic projection of one end of the communicated slit close to the groove structure on the base substrate.

19. The array substrate according to claim 7, wherein the second electrode layer comprises a plurality of strip sub-electrodes and slits located among the strip sub-electrodes, wherein the strip sub-electrode has a width of 2.5 to 3.5 microns and the slit has a width of 3.0 to 5.0 microns.

20. The array substrate according to claim 19, wherein a ratio of the width of the strip sub-electrode to the width of the slit is 0.5 to 0.8.

21. The array substrate according to claim 7, wherein an opening of the connection via-hole is in a rectangular shape, a size of the opening of the connection via-hole close to the base substrate in an extension direction of a scan line in the drive circuit layer is 10-12 microns, and the size of the opening of the connection via-hole close to the base substrate in an extension direction of a data line in the drive circuit layer is 6.5-7.5 microns, and
the second electrode layer has a common electrode and covers the connection via-hole, the second electrode layer comprises a plurality of strip sub-electrodes, slits located among the strip sub-electrodes, and drainage grooves serving as the groove structures, wherein the strip sub-electrode has a width of 2.5 to 3.5 microns and the slit has a width of 3.0 to 5.0 microns, the drainage grooves are in communication with the slits and extend to the connection via-hole, a length of a part of the drainage groove within the connection via-hole is 6.0 to 6.5 microns, and the drainage groove and the communicated slit have a same width and extension direction.

22. The array substrate according to claim 7, wherein the opening of the connection via-hole is in a circular shape and the opening close to the base substrate has a diameter of 7 to 8 microns, and
the second electrode layer has a common electrode and covers the connection via-hole, the second electrode layer comprises a plurality of strip sub-electrodes, slits located among the strip sub-electrodes, and drainage grooves serving as the groove structures, wherein the strip sub-electrode has a width of 2.5 to 3.5 microns and the slit has a width of 3.0 to 5.0 microns, the drainage grooves are in communication with the slits and extend to the connection via-hole, a length of a part of the drainage groove within the connection via-hole is 0.8 to 1.2 microns, and the drainage groove and the communicated slit have a same width and extension direction.

23. The array substrate according to claim 7, wherein an opening of the connection via-hole is in a rectangular shape, a size of the opening of the connection via-hole close to the base substrate in an extension direction of a scan line in the drive circuit layer is 11.5~13.5 microns, the size of the opening of the connection via-hole close to the base substrate in an extension direction of a data line in the drive circuit layer is 10 to 12 microns, and the size of the connection via-hole in the extension direction of the scan line is greater than the size of the connection via-hole in the extension direction of the data line, and
the second electrode layer has a pixel electrode and covers the connection via-hole, the second electrode layer comprises a plurality of strip sub-electrodes, slits located among the strip sub-electrodes, and drainage grooves serving as the groove structures, wherein the strip sub-electrode has a width of 2.5 to 3.5 microns and the slit has a width of 3.0 to 5.0 microns, the drainage grooves are in communication with the slits and extend to the connection via-hole, a length of a part of the drainage groove within the connection via-hole is 1.5 to 2.5 microns, and the drainage groove and the communicated slit have a same width and extension direction.

24. A display panel, comprising the array substrate of claim 7.

* * * * *